US011859300B2

(12) United States Patent
He et al.

(10) Patent No.: US 11,859,300 B2
(45) Date of Patent: *Jan. 2, 2024

(54) CONTROLLING PLATING ELECTROLYTE CONCENTRATION ON AN ELECTROCHEMICAL PLATING APPARATUS

(71) Applicant: Lam Research Corporation, Fremont, CA (US)

(72) Inventors: Zhian He, Lake Oswego, OR (US); Shantinath Ghongadi, Tigard, OR (US); Quan Ma, Lake Oswego, OR (US); Hyungjun Hur, Richardson, TX (US); Cian Sweeney, Portland, OR (US); Quang Nguyen, Tigard, OR (US); Rezaul Karim, Gilbert, AZ (US); Jingbin Feng, Ridgefield, WA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/809,124

(22) Filed: Jun. 27, 2022

(65) Prior Publication Data

US 2022/0333267 A1 Oct. 20, 2022

Related U.S. Application Data

(63) Continuation of application No. 17/248,151, filed on Jan. 11, 2021, now Pat. No. 11,401,623, which is a
(Continued)

(51) Int. Cl.
*C25D 17/00* (2006.01)
*C25D 17/10* (2006.01)
(Continued)

(52) U.S. Cl.
CPC .............. *C25D 17/001* (2013.01); *C25D 3/38* (2013.01); *C25D 17/002* (2013.01); *C25D 17/10* (2013.01);
(Continued)

(58) Field of Classification Search
CPC ......... C25D 21/16; C25D 21/18; C25D 21/14
See application file for complete search history.

(56) References Cited

U.S. PATENT DOCUMENTS 3,664,440 A 5/1972 Elenburg
4,003,263 A 1/1977 O'Rourke
(Continued)

FOREIGN PATENT DOCUMENTS

CN 101476150 A 7/2009
EP 0048579 B1 12/1984
(Continued)

OTHER PUBLICATIONS

Chinese First Office Action dated Jun. 1, 2015 issued in Application No. CN 2011-1040482.0.
(Continued)

*Primary Examiner* — Harry D Wilkins, III
(74) *Attorney, Agent, or Firm* — Weaver Austin Villeneuve & Sampson LLP

(57) ABSTRACT

Methods and electroplating systems for controlling plating electrolyte concentration on an electrochemical plating apparatus for substrates are disclosed. A method involves: (a) providing an electroplating solution to an electroplating system; (b) electroplating the metal onto the substrate while the substrate is held in a cathode chamber of an electroplating cell of electroplating system; (c) supplying the make-up solution to the electroplating system via a make-up solution inlet; and (d) supplying the secondary electroplating solution to the electroplating system via a secondary electroplating
(Continued)

solution inlet. The secondary electroplating solution includes some or all components of the electroplating solution. At least one component of the secondary electroplating solution has a concentration that significantly deviates from its target concentration.

18 Claims, 18 Drawing Sheets

Related U.S. Application Data continuation of application No. 16/178,402, filed on Nov. 1, 2018, now Pat. No. 10,927,475.

(60) Provisional application No. 62/580,390, filed on Nov. 1, 2017.

(51) Int. Cl.
| | | |
|---|---|---|
| C25D 3/38 | (2006.01) | |
| C25D 21/14 | (2006.01) | |
| C25D 21/18 | (2006.01) | |
| H01L 21/288 | (2006.01) | |

(52) U.S. Cl.
CPC ............. *C25D 21/14* (2013.01); *C25D 21/18* (2013.01); *H01L 21/2885* (2013.01)

(56) References Cited

U.S. PATENT DOCUMENTS

| | | |
|---|---|---|
| 4,105,532 A | 8/1978 | Haines et al. |
| 4,111,772 A | 9/1978 | Horn |
| 4,330,377 A | 5/1982 | Franks, Jr. |
| 4,459,185 A | 7/1984 | Obata et al. |
| 4,565,609 A | 1/1986 | Nobel et al. |
| 4,828,657 A | 5/1989 | Fukuoka et al. |
| 4,944,851 A | 7/1990 | Cordani et al. |
| 5,039,576 A | 8/1991 | Wilson |
| 5,194,141 A | 3/1993 | Suganuma et al. |
| 5,200,064 A | 4/1993 | Russ et al. |
| 5,312,539 A | 5/1994 | Thomson |
| 5,352,350 A | 10/1994 | Andricacos et al. |
| 5,403,460 A | 4/1995 | Sala et al. |
| 5,409,582 A | 4/1995 | Wimbish et al. |
| 5,456,756 A | 10/1995 | Ramaswami et al. |
| 5,518,957 A | 5/1996 | Kim |
| 5,785,833 A | 7/1998 | Vaughan |
| 5,883,762 A | 3/1999 | Calhoun et al. |
| 6,063,172 A | 5/2000 | Bokisa et al. |
| 6,113,769 A | 9/2000 | Uzoh et al. |
| 6,120,673 A | 9/2000 | Reiter et al. |
| 6,126,798 A | 10/2000 | Reid et al. |
| 6,156,167 A | 12/2000 | Patton et al. |
| 6,251,255 B1 | 6/2001 | Copping et al. |
| 6,333,275 B1 | 12/2001 | Mayer et al. |
| 6,458,262 B1 | 10/2002 | Reid |
| 6,471,845 B1 | 10/2002 | Dukovic et al. |
| 6,527,920 B1 | 3/2003 | Mayer et al. |
| 6,569,299 B1 | 5/2003 | Reid et al. |
| 6,726,824 B1 | 4/2004 | Khosla |
| 6,800,187 B1 | 10/2004 | Reid et al. |
| 6,821,407 B1 | 11/2004 | Reid et al. |
| 6,878,245 B2 | 4/2005 | Gandikota et al. |
| 6,890,416 B1 | 5/2005 | Mayer et al. |
| 6,989,084 B2 | 1/2006 | Tench et al. |
| 7,178,410 B2 | 2/2007 | Fraden et al. |
| 7,195,702 B2 | 3/2007 | Bokisa, Sr. et al. |
| 7,273,540 B2 | 9/2007 | Sonoda et al. |
| 7,622,024 B1 | 11/2009 | Mayer et al. |
| 8,128,791 B1 | 3/2012 | Buckalew et al. |
| 8,308,931 B2 | 11/2012 | Reid et al. |
| 8,475,644 B2 | 7/2013 | Mayer et al. |
| 9,045,841 B1 | 6/2015 | Buckalew et al. |
| 9,404,194 B2 | 8/2016 | Mayer et al. |
| 9,982,357 B2 | 5/2018 | Mayer et al. |
| 10,309,024 B2 | 6/2019 | Mayer et al. |
| 10,927,475 B2 * | 2/2021 | He .......................... C25D 21/14 |
| 11,401,623 B2 | 8/2022 | He et al. |
| 2004/0000491 A1 | 1/2004 | Kovarsky et al. |
| 2004/0065540 A1 | 4/2004 | Mayer et al. |
| 2004/0245113 A1 | 12/2004 | Bokisa, Sr. et al. |
| 2005/0062169 A1 | 3/2005 | Dubin et al. |
| 2005/0121317 A1 | 6/2005 | Klocke et al. |
| 2006/0062169 A1 | 3/2006 | Suzuki et al. |
| 2006/0086616 A1 | 4/2006 | Kurashina et al. |
| 2006/0144700 A1 | 7/2006 | Carson et al. |
| 2006/0144712 A1 | 7/2006 | Klocke |
| 2010/0032310 A1 | 2/2010 | Reid et al. |
| 2010/0116672 A1 | 5/2010 | Mayer et al. |
| 2010/0116674 A1 | 5/2010 | Luo et al. |
| 2010/0147679 A1 | 6/2010 | Feng et al. |
| 2011/0174379 A1 | 7/2011 | Stahl |
| 2011/0226613 A1 | 9/2011 | Rash et al. |
| 2011/0226614 A1 | 9/2011 | Rash et al. |
| 2012/0000786 A1 | 1/2012 | Mayer et al. |
| 2012/0138471 A1 | 6/2012 | Mayer et al. |
| 2013/0327650 A1 | 12/2013 | Mayer et al. |
| 2015/0041327 A1 | 2/2015 | Buckalew et al. |
| 2015/0325490 A1 | 11/2015 | Lee et al. |
| 2016/0312373 A1 | 10/2016 | Mayer et al. |
| 2018/0237933 A1 | 8/2018 | Mayer et al. |
| 2019/0127872 A1 | 5/2019 | He et al. |
| 2021/0130976 A1 | 5/2021 | He et al. |

FOREIGN PATENT DOCUMENTS

| | | |
|---|---|---|
| JP | H0424440 B2 | 4/1992 |
| JP | H1121692 A | 1/1999 |
| JP | 2000219993 A | 8/2000 |
| JP | 2004183091 A | 7/2004 |
| JP | 5186899 B2 | 4/2013 |
| KR | 20010090469 A | 10/2001 |
| TW | 201107536 A | 3/2011 |

OTHER PUBLICATIONS

Chinese Second Office Action dated Dec. 10, 2015 issued in Application No. CN 2011-1040482.0.
CN Office Action dated Aug. 31, 2022, in Application No. CN201880071780.5 with English translation.
International Preliminary Report on Patentability dated May 5, 2020 in PCT/US2018/057105.
International Search Report and Written Opinion issued in Application No. PCT/US2018/057105, dated Feb. 19, 2019.
Korean First Office Action dated Sep. 18, 2017 issued in Application No. KR 10-2011-0127675.
Taiwan Office Action and Search Report dated Jan. 26, 2016 issued in Application No. TW 100144031.
Taiwan Office Action and Search Report dated Sep. 4, 2015 issued in Application No. TW 100144031.
TW Office Action dated May 25, 2022, in Application No. TW107138506 with English translation.
U.S. Corrected Notice of Allowance dated Jul. 5, 2022 in U.S. Appl. No. 17/248,151.
U.S. Final Office Action, dated Jul. 17, 2020, issued in U.S. Appl. No. 16/178,402.
U.S. Notice of Allowance, dated Oct. 13, 2020 issued in U.S. Appl. No. 16/178,402.
U.S. Appl. No. 11/895,911, inventors Buckalew et al., filed on Aug. 27, 2007.
U.S. Final Office Action, dated Apr. 23, 2015, issued in U.S. Appl. No. 13/305,384.
U.S. Final Office Action, dated Feb. 2, 2011, issued in U.S. Appl. No. 11/590,413.
U.S. Final Office Action, dated Feb. 5, 2010, issued in U.S. Appl. No. 11/590,413.
U.S. Notice of Allowance, dated Jan. 23, 2018, issued in U.S. Appl. No. 15/198,787.

(56) References Cited

OTHER PUBLICATIONS

U.S. Notice of Allowance dated Jan. 25, 2019 issued in U.S. Appl. No. 15/958,525.
U.S. Notice of Allowance, dated Jan. 26, 2021 issued in U.S. Appl. No. 16/178,402.
U.S. Notice of Allowance, dated Jan. 30, 2015, issued in U.S. Appl. No. 13/359,343.
U.S. Notice of Allowance, dated Mar. 28, 2016 issued in U.S. Appl. No. 13/305,384.
U.S. Notice of Allowance dated Mar. 30, 2022, in U.S. Appl. No. 17/248,151.
U.S. Notice of Allowance, dated Oct. 27, 2011, issued in U.S. Appl. No. 11/590,413.
U.S. Notice of Allowance (Supplemental Notice of Allowability), dated Mar. 25, 2015, issued in U.S. Appl. No. 13/359,343.
U.S. Office Action, dated Apr. 19, 2010, issued in U.S. Appl. No. 11/590,413.
U.S. Office Action, dated Aug. 28, 2009, issued in U.S. Appl. No. 11/590,413.
U.S. Office Action, dated Aug. 6, 2010, issued in U.S. Appl. No. 11/590,413.
U.S. Office Action, dated Feb. 12, 2020, issued in U.S. Appl. No. 16/178,402.
U.S. Office Action, dated Feb. 18, 2011, issued in U.S. Appl. No. 11/895,911.
U.S. Office Action, dated Jul. 11, 2018, issued in U.S. Appl. No. 15/958,525.
U.S. Office Action, dated Jul. 13, 2017, issued in U.S. Appl. No. 15/198,787.
U.S. Office Action, dated May 24, 2011, issued in U.S. Appl. No. 11/590,413.
U.S. Office Action, dated Oct. 8, 2014, issued in U.S. Appl. No. 13/305,384.
U.S. Restriction Requirement dated Sep. 18, 2019 in U.S. Appl. No. 16/178,402.
KR Office Action dated Jan. 19, 2023 in Application No. KR10-2020-7015563 with English translation.
CN Office Action dated May 24, 2023, in Application No. CN201880071780.5 with English translation.
KR Office Action dated Sep. 18, 2023, in Application No. KR10-2023-7027628 with English translation.

\* cited by examiner

Minutes (from Initiation of Electroplating Processes without Interference of a Supplemental Plating Solution)

Minutes (from Initiation of Electroplating Processes without Interference of a Supplemental Plating Solution)

Minutes (from Initiation of Electroplating Processes without Interference of a Supplemental Plating Solution)

CONTROLLING PLATING ELECTROLYTE CONCENTRATION ON AN ELECTROCHEMICAL PLATING APPARATUS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

TECHNICAL FIELD

The present disclosure relates to the control of electroplating solution concentration, and in particular to such control as conducted on an electrochemical plating apparatus for semiconductor substrates.

BACKGROUND

Electrochemical deposition process is widely used in the semiconductor industry for metallization of integrated circuit manufacturing. One such application is copper (Cu) electrochemical deposition, which may involve depositing of Cu lines into the trenches and/or vias that are pre-formed in dielectric layers. In this process, a thin adherent metal diffusion-barrier film is pre-deposited onto the surface by utilizing physical vapor deposition (PVD) or chemical vapor deposition (CVD). A copper thin seed layer will then be deposited on top of the barrier layer, typically by a PVD deposition process. The features (vias and trenches) are then filled electrochemically with Cu through an electrochemical deposition process, during which the copper cation is reduced electrochemically to copper metal.

SUMMARY

In an electrochemical plating apparatus that has isolated anolyte and catholyte portions, the concentration of catholyte components (e.g., acid, anions, cations, additives, etc.) may be controlled by adding a secondary electroplating solution (also sometimes called a secondary electrolyte) into the catholyte. The composition of the secondary electroplating solution compared to a primary electroplating solution generally depends on chemical and/or physical reactions occurring during electroplating processes, but may be also designed to bring the catholyte concentration to a target concentration with only a small amount of dosing when compared to, e.g., the electroplating solution reservoir volume. The dosing and/or addition of the secondary electroplating solution to the electroplating solution, in certain embodiments, may be need-based or time-based, depending on the application. In other words, while the secondary electroplating solution is available, it might be used sparingly, if at all. For example, it might only be used during the initial part of an electroplating run, during which the primary electroplating solution changes concentration abruptly and significantly. Thereafter many substrates may be electroplated in succession without using additional secondary electroplating solution.

Certain embodiments herein relate to methods for controlling the electroplating solution concentration, and in particular to such control as conducted on an electrochemical plating apparatus for semiconductor substrates. In one aspect of the embodiments herein, a method is provided for electroplating metal onto a substrate during fabrication of a device. The method may involve (a) providing an electroplating solution to an electroplating system comprising: (i) an electroplating cell comprising an anode chamber and a cathode chamber and configured to hold the substrate in the cathode chamber while electroplating the metal onto the substrate, (ii) an electroplating solution reservoir configured to hold a portion of the electroplating solution while electroplating the metal onto the substrate, (iii) a recirculation system for delivering the electroplating solution between the electroplating cell and the electroplating solution reservoir, (iv) a make-up solution inlet for providing make-up solution to the electroplating system, and (v) a secondary electroplating solution inlet for providing a secondary electroplating solution to the electroplating system, wherein the electroplating solution includes multiple components for electroplating the metal onto the substrate; (b) electroplating the metal onto the substrate while the substrate is held in the cathode chamber; (c) supplying the make-up solution to the electroplating system via the make-up solution inlet, wherein the make-up solution includes some or all of the multiple components, each at a target concentration for electroplating the metal onto the substrate, wherein supplying the make-up solution to the electroplating system changes the electroplating solution's composition so that at least one of the multiple components in the electroplating solution moves closer to its target concentration; and (d) supplying the secondary electroplating solution to the electroplating system via the secondary electroplating solution inlet, wherein the secondary electroplating solution includes some or all of the multiple components, and wherein at least one component of the secondary electroplating solution has a concentration that significantly deviates from its target concentration.

The methods may involve repeating operations (b)-(d) to electroplate the metal onto a second substrate.

The methods may involve repeating operations (b)-(d) to electroplate the metal onto multiple additional substrates.

In some embodiments, the device may be an integrated circuit.

In some embodiments, the metal may be copper and/or cobalt.

In some embodiments, the multiple components of the electroplating solution may include metal ions and an acid.

In some embodiments, the multiple components of the electroplating solution may further include organic electroplating additives selected from the group consisting of: an accelerator, a suppressor, a leveler, and any combination thereof.

In some embodiments, the multiple components of the electroplating solution may further include chloride ion and/or borate ion.

In some embodiments, the multiple components of the electroplating solution may further include copper ion, an acid, chloride ion, and organic plating additives, and wherein the secondary electroplating solution contains acid at a target concentration for the acid and copper ion at a copper ion secondary concentration that is significantly higher than a target concentration for copper ion. The secondary electroplating solution may further include chloride ion at a target concentration for the chloride ion, and/or wherein the secondary electroplating solution contains organic plating additives at a target concentration for the organic plating additives. The copper ion secondary concentration may be between about 5 and 50 times greater than the target concentration for copper ion. The secondary electroplating solution may further include chloride ion at a chloride ion secondary concentration that is higher than a target concentration for the chloride ion.

In some embodiments, the multiple components of electroplating solution include cobalt ion, an acid, borate ion, and organic plating additives, and wherein the secondary electroplating solution includes acid at a target concentration for the acid, borate ion at a target concentration for borate ion, and cobalt ion at a cobalt ion secondary concentration that is significantly lower than a target concentration for cobalt ion. The target concentration for cobalt ion may be between about 5 and 50 times greater than the cobalt ion secondary concentration.

In some embodiments, the multiple components of electroplating solution include cobalt ion, an acid, borate ion, and organic plating additives, and wherein the secondary electroplating solution includes acid at a target concentration for the acid, cobalt ion at a target concentration for cobalt ion, and borate ion at a borate ion secondary concentration that is significantly higher than a target concentration for borate ion. The borate ion secondary concentration is between about 1.2 and 2 times greater than the target concentration for borate ion.

In some embodiments, the multiple components of electroplating solution include cobalt ion, an acid, borate ion, and organic plating additives, and wherein the secondary electroplating solution includes acid at a target concentration for the acid, borate ion at a borate ion secondary concentration that is significantly higher than a target concentration for borate ion, and cobalt ion at a cobalt ion secondary concentration that is significantly lower than a target concentration for cobalt ion.

The methods may involve dosing a single component solution comprising only one of the multiple components for electroplating the metal onto the substrate into the electroplating solution reservoir. The single component solution may be an aqueous chloride ion solution. Also, in certain embodiments, the single component solution may be an aqueous organic electroplating additives solution.

In some embodiments, supplying the secondary electroplating solution to the electroplating system includes supplying the secondary electroplating solution to the electroplating solution reservoir and/or the cathode chamber of the electroplating cell.

In some embodiments, the electroplating cell further includes an ion transfer separator between the anode chamber and the cathode chamber configured to provide a path for ionic communication between the electroplating solution in the anode chamber and the cathode chamber. The ion transfer separator may include a cation exchange membrane.

Certain embodiments herein relate to systems for electroplating metal onto a substrate during fabrication of a device. A system may involve (a) an electroplating cell comprising an anode chamber and a cathode chamber and configured to hold the substrate in the cathode chamber while electroplating the metal onto the substrate; (b) an electroplating solution reservoir configured to hold a portion of the electroplating solution while electroplating the metal onto the substrate; (c) a recirculation system for delivering the electroplating solution between the electroplating cell and the electroplating solution reservoir; (d) an make up solution inlet for providing make up solution to the electroplating system; (e) a secondary electroplating solution inlet for providing a secondary electroplating solution to the electroplating system; and (f) a controller configured to execute instructions for: (i) providing an electroplating solution to the electroplating system, wherein the electroplating solution includes multiple components for electroplating the metal onto the substrate, (ii) electroplating the metal onto the substrate while the substrate is held in the cathode chamber, (iii) supplying the make up solution to the electroplating system via the make up solution inlet, wherein the make up solution includes some or all of multiple components, each at a target concentration for electroplating the metal onto the substrate, wherein supplying the make up solution to the electroplating system changes the electroplating solution's composition so that at least one of the multiple components in the electroplating solution moves closer to its target concentration; and (iv) supplying the secondary electroplating solution to the electroplating system via the secondary electroplating solution inlet, wherein the secondary electroplating solution includes some or all of multiple components, and wherein at least one component of the secondary electroplating solution has a concentration that significantly deviates from its target concentration.

In some embodiments, the electroplating cell further includes an ion transfer separator between the anode chamber and the cathode chamber configured to provide a path for ionic communication between the electroplating solution in the anode chamber and the cathode chamber. The ion transfer separator may include a cation exchange membrane. In certain embodiments, the electroplating cell further may include one or more auxiliary electrode chambers. The one or more one or more auxiliary electrode chambers may be one or more cathode chambers.

In some embodiments, the controller is further configured to execute instructions for causing any one or more of the method operations recited above.

In one aspect of the embodiments herein, a method is provided for plating metal onto a substrate during fabrication of a device. The method may involve, (a) providing a plating solution to a plating system, the plating solution for plating the metal onto the substrate and including multiple components having target concentrations; (b) plating the metal onto the substrate; and (c) supplying a secondary plating solution to the plating system wherein the secondary plating solution includes some or all of the multiple components, and wherein at least one component of the secondary plating solution has a concentration that significantly deviates from its target concentration.

These and other features will be described below with reference to the associated drawings.

BRIEF DESCRIPTION OF THE DRAWINGS

Exemplary embodiments will now be described in conjunction with the drawings, in which.

DETAILED DESCRIPTION

Figure 1:
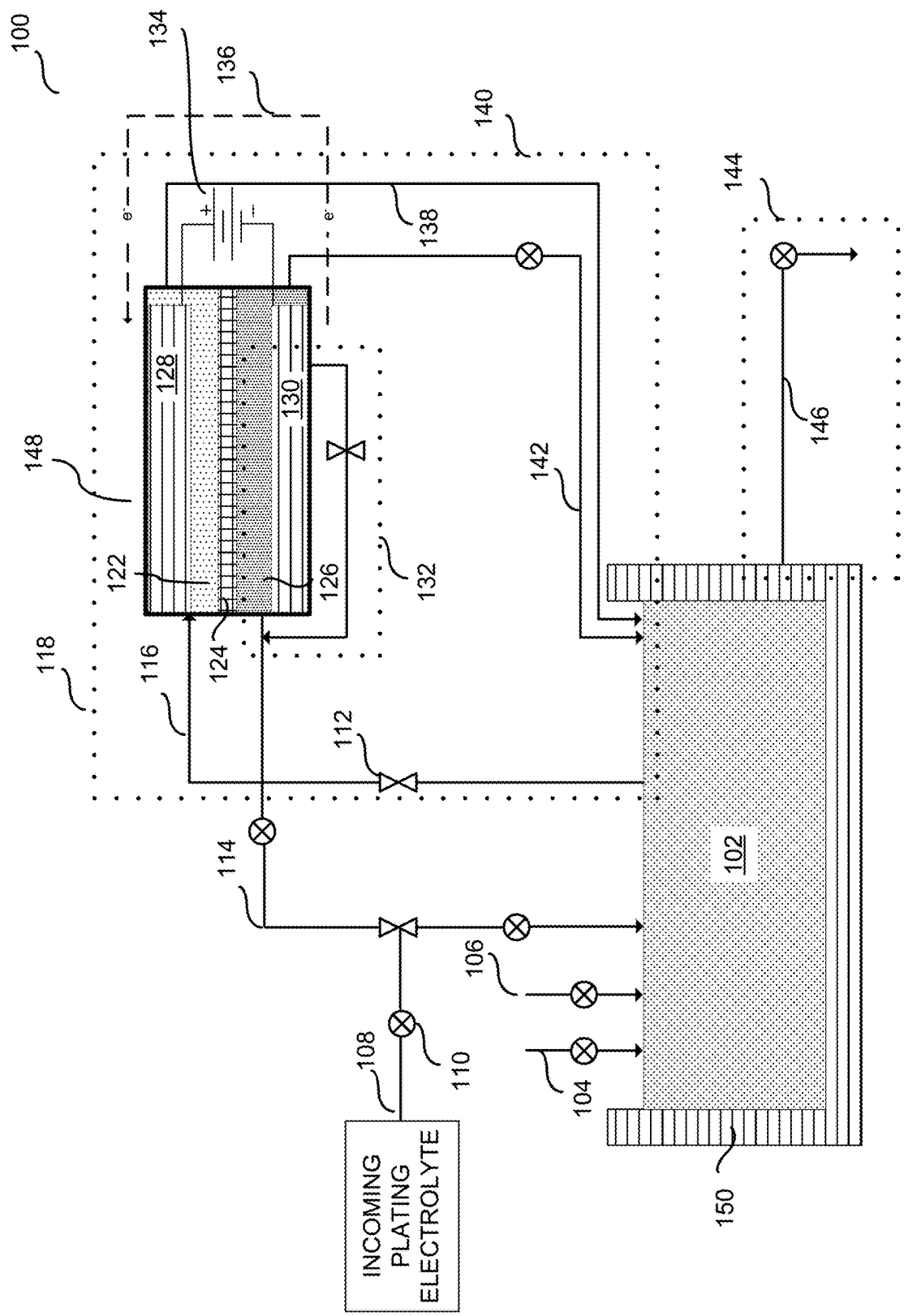
FIG. 1 is a schematic diagram of an exemplary plating electrolyte, or electroplating solution, recirculation and/or dosing system.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Introduction and Context

Control of the composition and concentration of the electroplating solution used in an electroplating system may be important to the performance of the electrochemical deposition process. Typically, there are multiple components in a given electroplating solution. For example, the composition of electrolyte used for the deposition of copper on a wafer may vary, but may include sulfuric acid, copper salt (e.g., $CuSO_4$), chloride ion, and a mixture of organic additives. The composition of electroplating solution is selected to optimize the rate and uniformity of electroplating inside features of the wafer, or in the field of the wafer, e.g., an area without features formed on or in the wafer. During the plating process, copper salt serves as the source of copper cation, and also provides conductivity to the electroplating solution; further, in certain embodiments, sulfuric acid enhances electroplating solution conductivity by providing hydrogen ions as charge carriers. Also, organic additives, generally known in the art as accelerators, suppressors, or levelers, are capable of selectively enhancing or suppressing rate of copper (Cu) deposition on different surfaces and wafer features. Chloride (Cl) ion is useful for modulating the effect of organic additives, and may be added to the electroplating bath for the purpose. In some implementations, another halide (e.g., bromide or iodide) is used in place of or in addition to chloride.

Generally, separation of anodic and cathodic regions of an electroplating cell by a semi-permeable membrane may be desirable since chemical processes occurring at the anode and at the cathode during electroplating may not necessarily be compatible. For example, during operation, insoluble particles may form on the anode. Protection of the wafer from such insoluble particles is often desirable to avoid interference of such particles with subsequent metal deposition processes conducted on the wafer. Also, the restriction of organic additives to the cathodic portion of the plating cell may also be desirable to prevent such additives from contacting and/or reacting with the anode. For instance, a suitable separating membrane would allow for the flow of ions, and hence, current, between the anodic and cathodic region of the plating cell, but will still restrict unwanted particles and/or organic additives from permeating through the separating membrane. Thus, usage of the separating membrane during electrodeposition will create different chemical environments in the cathodic and anodic regions of a plating cell equipped with the separating membrane. Electrolyte contained in the anodic region of the plating cell may be referred to as the "anolyte." Likewise, electrolyte contained in the cathodic region of the plating cell may be referred to as the "catholyte."

An electroplating apparatus having a membrane to separate the anodic region from the cathodic region is described in further detail in U.S. Pat. No. 6,527,920 entitled "Copper Electroplating Apparatus" to Mayer et al. and is incorporated in its entirety herein by reference. As discussed above, such a separating membrane allows current to flow between the anodic region and the cathodic region, but may be further configured to selectively restrict current flow depending on the type of ion. That is, the membrane separating the catholyte and anolyte may demonstrate selectivity for different types of ions. For example, for a Cu plating application, the separating membrane may allow passage of hydrogen ions ($H^+$) at a faster rate than the passage rate of copper ions, e.g., $Cu^{2+}$ and/or $Cu^+$. Depending on the selectivity of the membrane, the mobility of particular types of ions or current more generally may be predominantly carried by hydrogen ions, until a certain molar ratio between, for example, $Cu^{2+}$ and $H^+$ concentrations is achieved. After this ratio is achieved, copper ions and hydrogen ions may begin to carry current across the membrane proportionally so that $Cu^{2+}$ and acid concentration in the anodic portion of the electrochemical cell stabilize. Therefore, until a certain molar ratio between copper ions and hydrogen ions is achieved, the anolyte may be continuously depleted of its acidic component, since hydrogen ions are the main current carriers under these conditions. Concurrent with the depletion of the acidic component of the anolyte, the concentration of copper salt is increased, especially when a copper-containing anode is used. The above effect, e.g., depletion of acid from the anolyte with a commensurate increase in copper salt, may be referred to in the art as an "acid/metal ion partition effect" taking place inside the anode chamber, or "anode chamber depletion effect," since acid is depleted in the anode over a period of time.

The acid/metal partition processes described above may also inadvertently result in several undesirable side effects on the plating system. Several such side effects are described in U.S. Pat. No. 8,128,791 (herein the '791 patent) entitled "Control of Electrolyte Composition in a Copper Electroplating Apparatus" to Buckalew et al., incorporated by reference in its entirety herein. Undesirable side effects include potential crystallization, or precipitation, of excess salt from the electroplating solution onto the anode surface inside the anode chamber. Also, water may seep across the membrane due to the electro-osmotic effect by creating pressure gradient between the anodic portion and cathodic portion of the apparatus, which may ultimately lead to membrane damage and failure. U.S. Pat. No. 8,128,791 describes ways of controlling the anodic electrolyte composition by frequently replenishing the anode chamber with plating electrolyte. Such a process may be referred to in the art as "bleed and feed." Alternative to bleed and feed, diluted electrolyte may be added into the anode chamber of the plating cell.

The acid/metal ion partition effect, described above, may also create undesirable electroplating solution concentration fluctuation on the cathodic side of an electroplating cell, which, in turn, may impact electroplating process performance. A few examples are described below.

To understand the above discussed phenomenon, a typical electrolyte management system is illustrated in FIG. 1. As shown, there are a few major segments, e.g., an anode solution loop 132 and/or a cathode solution loop 118, in an electrolyte management system 100. Typically, there is a central bath 102 that provides electroplating solution to a plating cell 148 and a main cathode chamber 122. The central bath 102 includes a solution recirculation loop (not shown in FIG. 1). Additionally, in certain embodiments or configurations, the central bath may also have a temperature control, and a dosing system such as that for additive dosing, deionized water (DI) dosing, and dosing of other active bath components. Further, in some embodiments, the central bath 102 may be equipped with a draining or overflow line 146 leading away from the central bath 102 to remove unwanted electroplating solution when appropriate. Moreover, in a plating apparatus, such as the plating cell 148, with separate anodic and cathodic portions, the anodic portion, such as main anode chamber 126, may have a dedicated recirculation loop 132, and dosing line (not shown in FIG. 1), and overflow and/or drain line (not shown in FIG. 1). In such a configuration, the main cathode chamber 122 may be configured to receive plating electrolyte from the central bath 102, circulate the electrolyte toward the plating cell 148 by a feed line 112 and direct overflow back to the central plating bath 102 by cell and/or overflow drain line 142. One skilled in the art will appreciate that the configuration shown in FIG. 1 is exemplary and many other suitable configurations may exist without departing from the scope of the disclosure. Further, certain variations and/or configurations of system 100 shown in FIGS. 1, 7, 9, 11A and 12 are intended to be representative schematics only and not to be interpreted as literal layouts or configurations of system 100.

The electrolyte management system 100 shown in FIG. 1 will be used to describe variants of the system 100 in relation to supplying a secondary, or supplemental, electrolyte to various system 100 components to regulate undesirable electroplating solution concentration fluctuation on either the cathodic or anodic sides of the plating cell 148. Such variants are shown in FIGS. 7, 9, 11A and 12 and described in further detail below. Generally, system 100 shown in FIG. 1 includes the cathode solution loop 118 and the anode solution loop 132, which, in certain embodiments, may be in fluid communication with one another through the bath 102 contained in an electroplating solution reservoir 150. During normal operation of system 100, incoming plating electrolyte, sometimes called make-up solution, having a defined concentration of metal ion in solution with acid, is provided to system 100 via line 108. Various regulation points 110, such as valves, pressure, and/or flow controllers may be installed on line 108, and/or other lines similar thereto, to regulate fluid flow through the line upon which the regulation point 110 is installed. Similarly, mixing point 112 may receive fluid flow from an incoming line 108. Mixing points 112 may likewise be installed as needed throughout system 100 to regulate delivery and quantity of fluid flowing through lines 108, etc.

Figure 2:
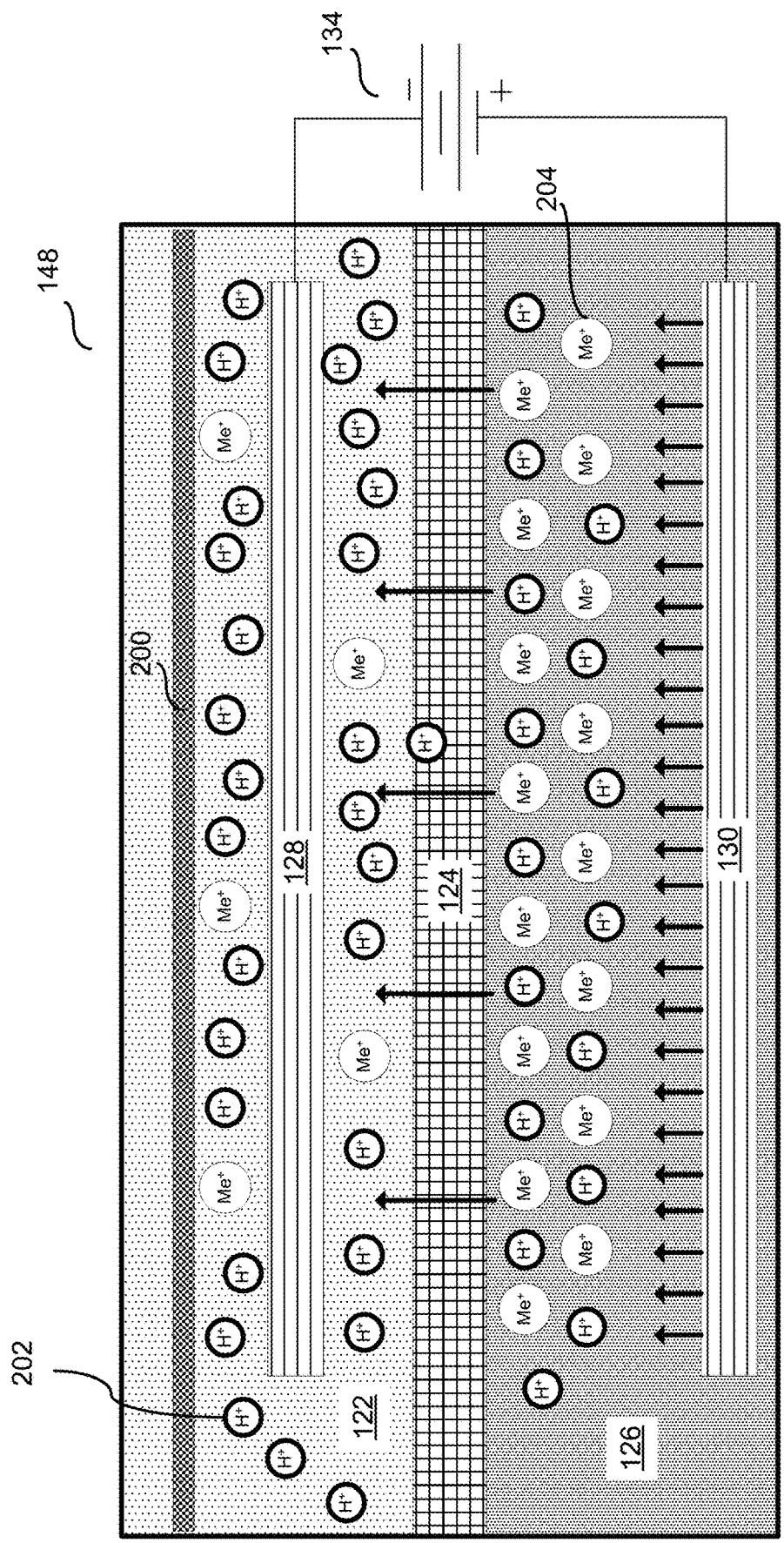
FIG. 2 illustrates an electroplating bath-side vs. metal ion partition effect, e.g., showing the movement of metal ions selectively through a semi-permeable membrane.

Thus, incoming plating electrolyte may flow through regulation point 110 to enter bath 102 to accumulate in the reservoir 150 intended to hold bath 102. In certain embodiments, organic additives are flowed into bath 102 via line 104. Similarly, de-ionized (DI) water may be flowed into bath 102 via line 106 to regulation concentration levels of the various components, or ingredients, of bath 102. Operation of system 100 may involve the pumping of bath 102 fluid through line 116 toward the cathode side 122 of the plating cell 148 for accumulation therein. In certain embodiments, a cathode 128 may be at least partially submerged in the cathode side 122 and electrically connected to an anode 130, which may be similarly submerged in the anode side 126 to complete an electric circuit 134. Further, electrical current (or more precisely the electrons carrying the current) is generally in the direction 136, e.g., from the negatively charged anode 130 to the positively charged cathode 128. The electric current drives reaction of metal ions, e.g., copper ions, $Cu^{2+}$, in solution with acid in the cathode side, or compartment, 122, allowing for electroplating of such copper metal on a wafer 200, as shown in FIG. 2, positioned in the cathode side 122 of the plating cell 148.

Solution from the cathode side 122 may be pumped through a cell overflow, or drain, line 138 back to bath 102 as needed. Similarly, solution from the anode side 126 may be pumped through an anode drain line 142 also to the bath 102 as needed. Overflow from bath 102 may be intermittently be pumped out of system 100 through a bath overflow, or drain, line 146, which may be referred to more generally as a bath dosing and overflow control loop 144. In certain embodiments, the bath dosing and overflow control loop may include a recirculation pump (not shown), a dosing line (not shown), the bath overflow line 146, and a temperature control apparatus and/or mechanism (not shown). Together supplying make-up solution via line 108 and dumping electrolyte from the reservoir 150 holding primary electroplating solution, or bath, 102 serves as the bleed and feed process.

Figure 3A:
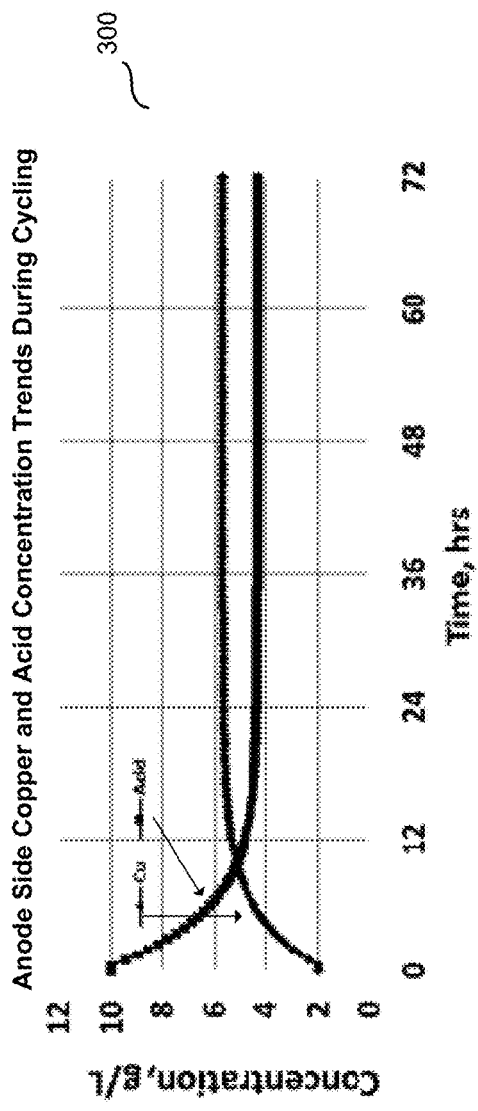
FIGS. 3A-3D show various graphs illustrating electroplating bath concentration drift as a result of electroplating conducted in accordance with one or more embodiments disclosed herein.
Figure 3B:
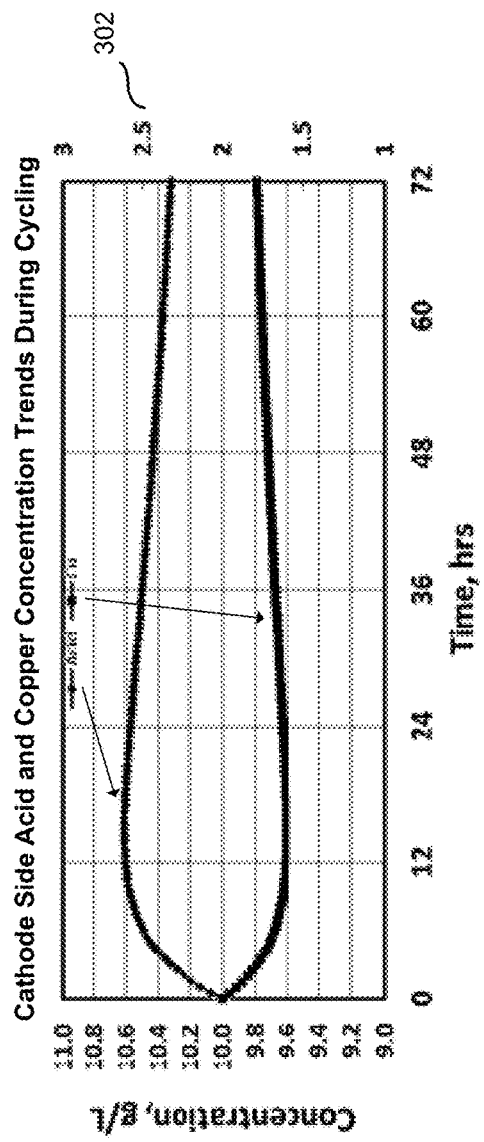
Figure 3C:
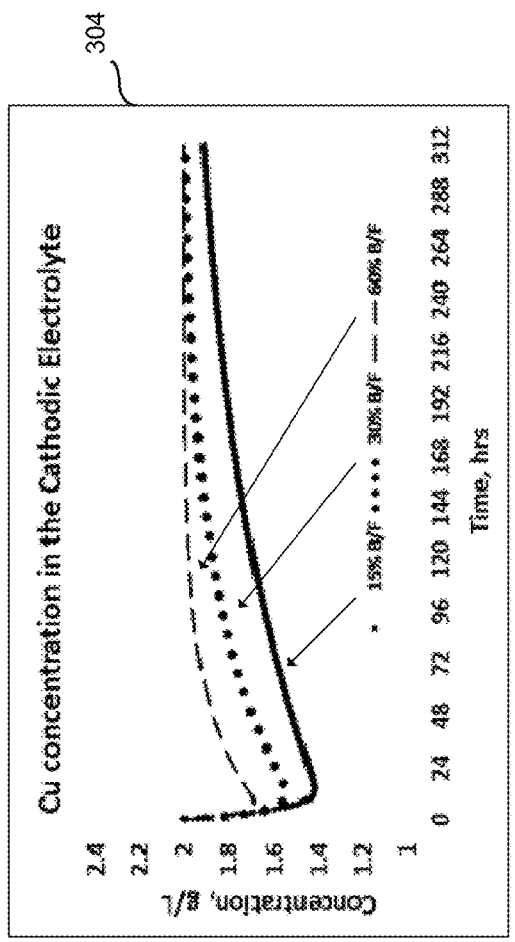
Figure 3D:
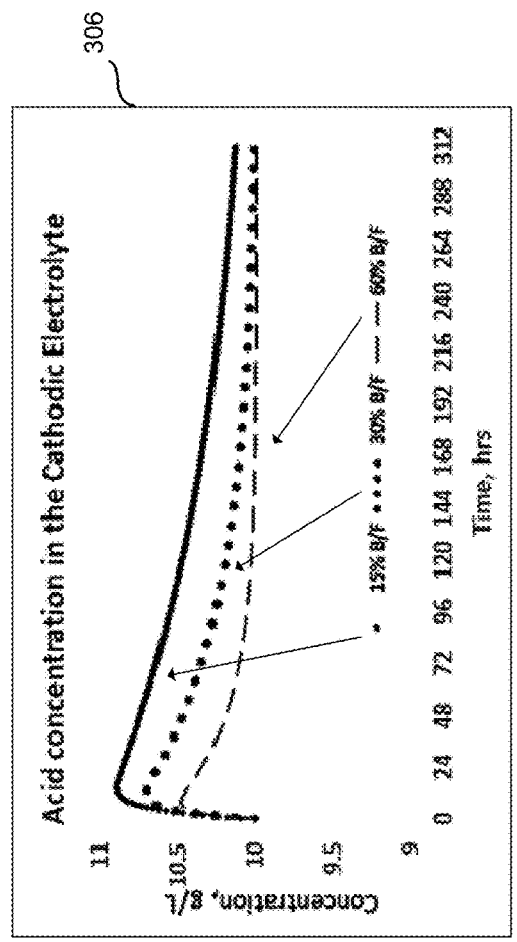
Figure 4:
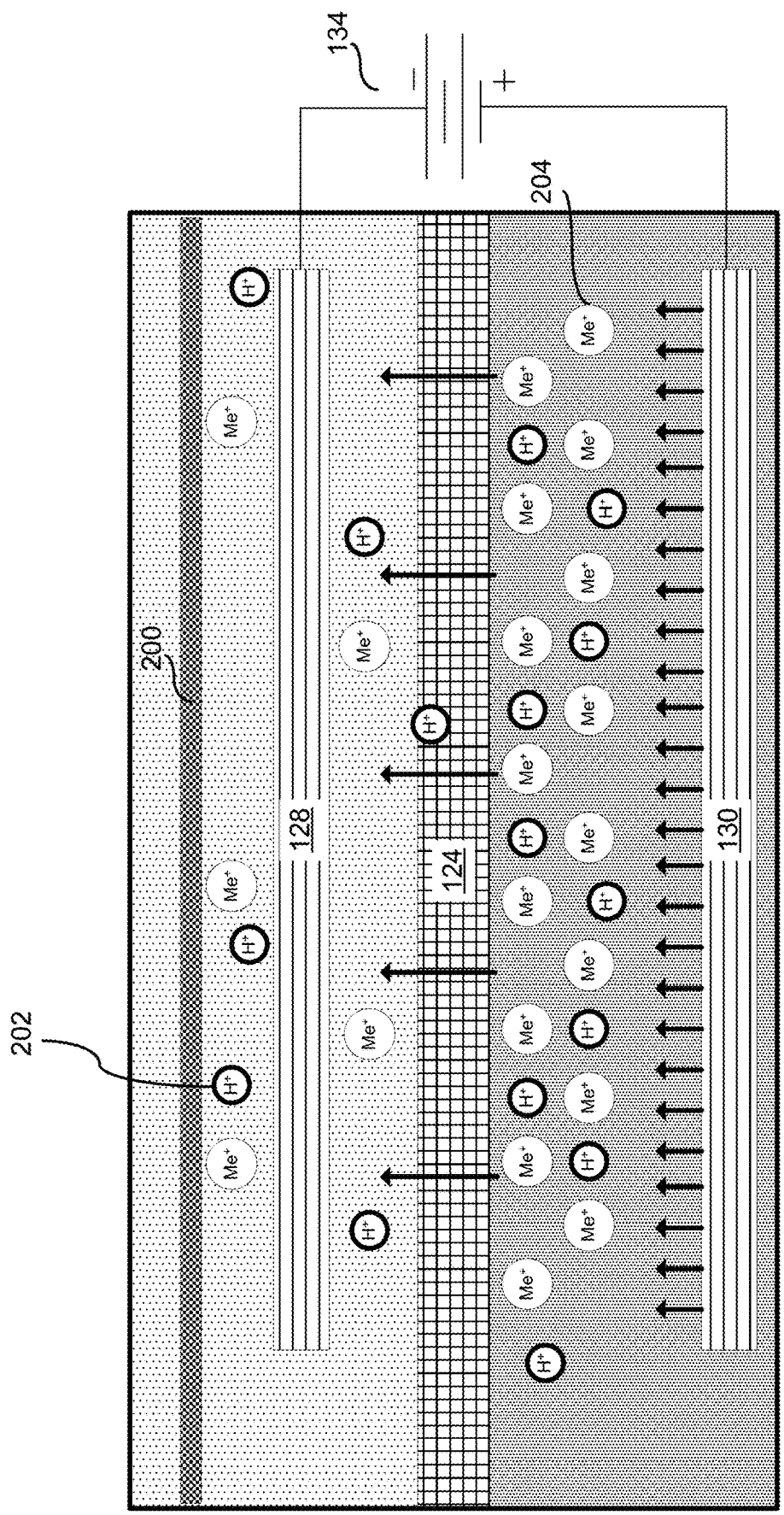
FIG. 4 illustrates a relatively low plating current efficiency situation of that shown in FIG. 2.

A factor to consider during supply of plating electrolyte to the cathodic side 122 to conduct electroplating on a wafer contained therein is the acid/metal ion partition effect, as described earlier. This effect can be observed in a copper plating process and may apply to other similar plating system. As illustrated in FIG. 2, on the anode, Cu ions, e.g., shown as metal ions, or $Me^+$, are de-plated into the anodic solution due to the passing of direct electric current through the oxidation reaction of $Cu \rightarrow Cu^{2+}+2e$. On the cathode side 122, the $Cu^{2+}$ ions are extracted from the solution through the reaction of $Cu^{2+}+2e \rightarrow Cu$. Analogously, across membrane 124 on the anode side 126, due to acid carrying a large portion of the plating current, the anodic electrolyte, which had become metal ion rich, slowly depletes acid or $H^+$ ions, over time. On the cathode side 122, since metal ions (e.g., cupric ions for Cu plating) are removed from solution upon electroplating or electrodeposition upon wafer 200 contained therein, while the solution flowing across the separation membrane (from anode chamber to cathode chamber) is acid rich. As mentioned, ionic transfer through the membrane favors hydrogen ions over copper ions. Thus, copper ion concentration in the cathode side 122 would drop over time, while acid concentration therein would increase, as illustrated in FIG. 3B, e.g., showing an initial spike in acid concentration followed by eventual tapering thereof as concentration levels approach a steady-state condition. As described elsewhere, the acid metal ion partition effect may be obviated by adopting a high electrolyte replenish rate to the anodic side 126 and/or on the bath 102, which in fluid communication with the cathodic side 122 in many configurations. But high replenish rates can unnecessarily waste electroplating solution and increase the operation cost of the electroplating apparatus.

The acid/metal ion partition effect may have a substantial impact on electroplating solutions having a relatively low metal ion concentration (e.g., about 5 g/l or lower). In such solutions, a concentration change of as little as a few tenths of a gram per liter can greatly impact the overall concentration of the metal ion in the solution and hence overall electroplating performance. For example, if the target copper ion concentration is about 2 g/l and the concentration drift depletes about 0.6 g/l of copper from the catholyte, the concentration has now dropped by 30% and the plating performance may therefore experience a significant negative impact.

Other variations observed of plating with metals other than copper are shown in Figures through 6A-6D. More particularly, cobalt (Co) may be selected to be used as the metal for such plating processes. As in a copper plating electrolyte, the cobalt plating electrolyte may be configured to include cobalt salts, sulfuric acid, organic additives, and boric acid as a buffer solution.

In this plating process, as in previous Cu plating example, metal ions are stripped from the anode through the following reaction: Me-e→Me$^+$. Simultaneously, at the cathode surface, due to lower than 100% plating current-efficiency for metal plating (current efficiency is defined here as the metal plating (Me$^+$+e→Me) current as a percentage of the total current delivered to the anode), the two reduction reactions happen at the same time: Co$^{2+}$+2e→Co and 2H$^+$+2e→H$_2$. The amount of current consumed by each reaction varies between plating process settings. Over a long term, the net effects of this plating process on the plating bath electrolyte are: (1) metal ion concentration increase since more is released from anode than consumed at cathode; (2) acid concentration drop since acid is only consumed on the cathode side without being supplied from the anode; (3) boric acid (H$_3$BO$_3$) concentration does not change since boric acid is not actively involved in the reaction. This is illustrated in FIG. 5. Note that if the acid metal ion partition effect happened in the anodic side could further shift the metal ion and acid concentration if the amount of charge carried by acid through the membrane is significant. But in some applications, due to the much lower concentration of acid as compared to the metal ion concentration, the partition effect becomes negligible. For simplicity of discussion here, the partition effect on cathodic electrolyte concentration for this kind of plating process was not included.

Figure 6A:
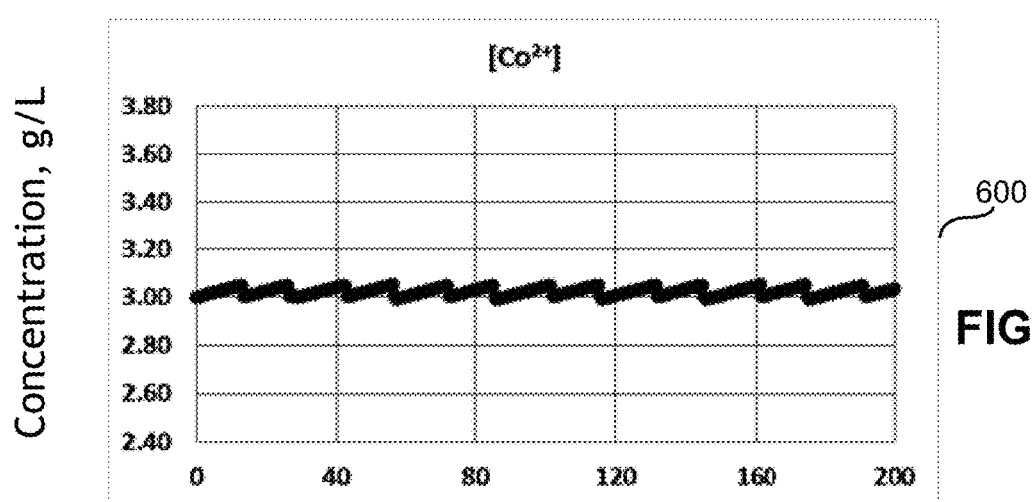
FIGS. 6A-6C show various graphs illustrating electroplating bath concentration trends with acid dosing, e.g., to replenish acid, and de-ionized (DI) water dosing to control cobalt ion concentration [$Co^{2+}$] for that shown in FIG. 4.
Figure 6B:
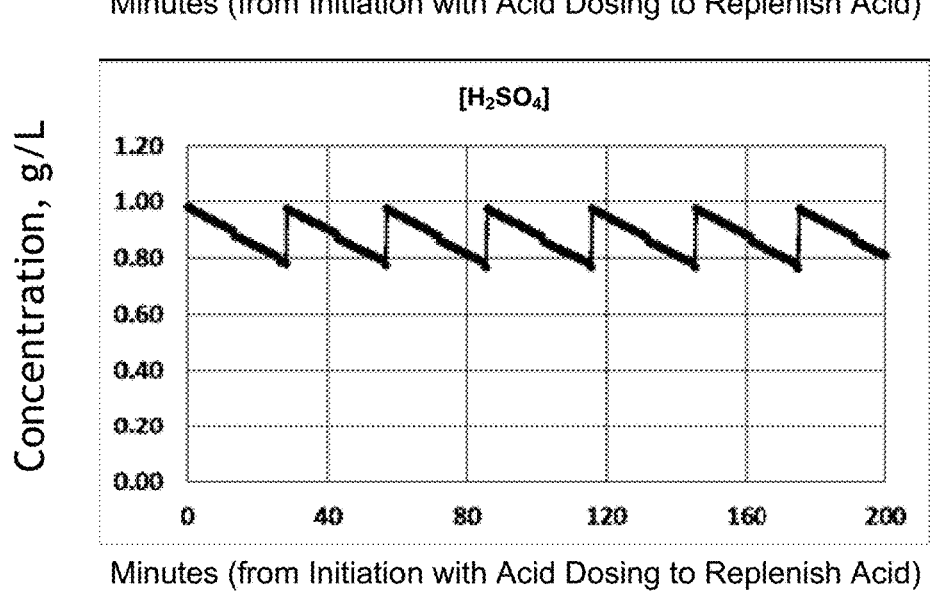

With the net consumption of acid from the plating electrolyte, acid dosing to the plating bath may be implemented in the above discussed system, e.g., the electrolyte management system 100. For process performance considerations, Co ion concentration would also needs to be controlled, by adding de-ionized (DI) water to the plating electrolyte. As a result of both acid and DI dosing to the bath, boric acid concentration would drop over time without any dosing mechanism. This is illustrated in FIG. 6. Since boric acid (any other component of similar function in other metal electroplating process) may be important for the Co plating process, the concentration of boric acid needs to be addressed as well.

On a plating apparatus, it is sometimes desirable to have an auxiliary cathode, as disclosed in U.S. Pat. No. 8,308,931 entitled "Method and Apparatus for Electroplating" to Reid et al., and U.S. Pat. No. 8,475,644 entitled "Method and Apparatus for Electroplating" to Mayer et al. both incorporated herein by reference in their entireties. Implementing an auxiliary cathode, or auxiliary anode, in an electrolyte management system provide certain advantages. The auxiliary cathodes are usually contained in small isolated chambers to avoid contacting with the main cathode (wafer substrate in a plating apparatus), and they are usually of smaller size as compared to the main cathode (wafer substrate). It is sometimes desirable to have different concentration for the electrolyte in the auxiliary cathode chamber. For example, it is sometimes preferred to have higher anion concentration (than in the plating electrolyte for main cathode) in the auxiliary cathode chamber so that higher current could be applied on the auxiliary cathode.

Definitions

The following terms are used intermittently throughout the instant disclosure:

"Substrate"—In this application, the terms "semiconductor wafer," "wafer," "substrate," "wafer substrate" and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Further, the terms "electrolyte," "electroplating bath," "plating bath," "bath," "electroplating solution," and "plating solution" are used interchangeably. The following detailed description assumes the embodiments are implemented on a wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like.

"Metal"—a material (an element, compound, or alloy) that is, for the purposes of this disclosure, desirable for plating onto a substrate or wafer. Examples include copper, cobalt, tin, silver, nickel, and alloys or combinations of any of these.

"Electroplating cell"—a cell, typically configured to house an anode and a cathode, positioned opposite to each other. Electroplating, which takes place on the cathode in an electroplating cell, refers to a process that uses electric current to reduce dissolved metal cations so that they form a thin coherent metal coating on an electrode. In certain embodiments, an electroplating cell has two compartments, one for housing the anode and the other for housing the cathode. In certain embodiments, an anode chamber and a cathode chamber are separated by a semi-permeable membrane that permits for the selective movement of concentrations of ionic species therethrough. The membrane may be an ion exchange membrane such as a cation exchange membrane. For some implementations, versions of Nafion™ (e.g., Nafion 324) are suitable.

"Anode chamber"—a chamber within the electroplating cell designed to house an anode. The anode chamber may contain a support for holding an anode and/or providing one or more electronic connections to the anode. The anode chamber may be separate from the cathode chamber by a semi-permeable membrane. The electrolyte in the anode chamber is sometimes referred to as anolyte.

"Cathode chamber"—a chamber within the electroplating cell designed to house a cathode. Often in the context of this disclosure, the cathode is a substrate such as a wafer such as a silicon wafer having multiple partially fabricated semiconductor devices. The electrolyte in the cathode chamber is sometimes referred to as catholyte.

"Electroplating solution (or electroplating bath, plating electrolyte, or primary electrolyte)"—a liquid of dissociated metal ions, often in solution with a conductivity enhancing component such as an acid or base. The dissolved cations and anions disperse uniformly through the solvent. Electrically, such a solution is neutral. If an electric potential is applied to such a solution, the cations of the solution are drawn to the electrode that has an abundance of electrons, while the anions are drawn to the electrode that has a deficit of electrons.

"Make-up solution"—a type of electroplating solution that typically contains all or nearly all components of the primary electroplating solution. Make-up solution is provided to an electroplating solution to maintain the concentration of solution components within desired ranges, chosen to maintain good electroplating performance. This approach is used because concentrations of components vary in the solution drift or vary with time due to any of a number of factors as described below. Make-up solution is often provided as the "feed" of a bleed and feed system. Often the concentrations of components in the make-up solution are similar or identical to the target concentrations for those components. Some make-up solutions do not include organic plating additives.

"Recirculation system"—provision of fluid substances back into a central reservoir for subsequent re-use. A recirculation system may be configured to efficiently re-use electroplating solution and also to control and/or maintain concentration levels of metal ions within the solution as desired. A recirculation system may include pipes or other fluidic conduits together with a pump or other mechanism for driving recirculation.

"Target concentration"—a concentration level of metal ions and/or other components in the electroplating solution used to achieve desired plating performance. In various embodiments, components of the make up solution are provided at the target concentrations.

"Secondary electroplating solution (or secondary electrolyte)"—An additional electroplating solution, similar to the make-up solution, but having a concentration of metal ion or other component that substantially deviates from its target concentration in the electroplating solution. In certain embodiments, the secondary electroplating solution is applied to remedy undesirable concentration drift of one or more components in the electroplating solution.

Concentrations recited in g/l refer to the total mass of a component in grams per one liter of solution. For example, a 10 g/l concentration of component A means that 10 grams of component A are present in a one liter volume of the solution containing component A. When specifying a concentration of an ion such as copper ion or cobalt ion in g/l, the concentration value refers to the mass of the ion alone (not the salt or salts from which the ion was produced) per unit volume of solution. For example, a concentration of 2 g/l of copper ion contains 2 g of copper ion per liter of solution in which the copper ion is solubilized. It does not refer to 2 grams of copper salt (e.g., copper sulfate) per liter of solution or otherwise refer to the mass of the anion. However, when referring to the concentration of an acid such as sulfuric acid, methane sulfonic acid, or boric acid, the concentration value refers the mass of the entire acid (hydrogen and anion) per unit volume. For example, a solution having 10 g/l sulfuric acid contains 10 grams of $H_2SO_4$ per liter of solution.

Electroplating Systems Using a Secondary Electrolyte

Included in this disclosure are a method and an apparatus allowing practice of such a method, to control the plating electrolyte concentration provided to a plating apparatus, primarily directed to the cathodic side of the apparatus. In certain embodiments, a similar approach may be used to control the electrolyte concentration in the anodic portion of the plating apparatus, which could in turn impact the electrolyte concentration on the cathodic side.

A method disclosed herein involves adding a secondary or supplemental, plating electrolyte to the plating apparatus, which may receive and use a plating electrolyte of a target concentration for plating onto the main cathode (wafer substrate).

The secondary electrolyte is often of a different composition from the primary plating electrolyte or a target concentration thereof. Examples of features of the secondary electrolyte include that:

(1) The secondary electrolyte contains most, or all, of the components contained by the primary electrolyte. In certain embodiments, the secondary electrolyte lacks organic plating additives, while the primary electrolyte includes such additives. In various embodiments, the secondary electrolyte includes all but one or all but two of the components of the primary electrolyte. For example, in a copper-acid plating system, the secondary electrolyte may lack chloride ion and/or organic plating additives, but otherwise has all the other remaining components of the copper-acid primary electrolyte. In another example, a cobalt-acid plating system may employ a secondary electrolyte that lacks cobalt ions and/or organic plating additives, but otherwise has all the other remaining components of the cobalt-acid primary electrolyte.

(2) Most, but not all, the components of the secondary electrolyte may have the same, or substantially the same, concentration as in the primary electrolyte, particularly the target concentrations of such components in the primary electrolyte. In some cases, these components of the secondary electrolyte have the same, or substantially the same, compositions as in a make up solution (MS). For example, in an acid-copper plating system, the secondary electrolyte may include acid and chloride ion at concentrations that are substantially the same as those in the primary electrolyte. In another example, in an acid-cobalt plating system, the electrolyte may include acid and cobalt ion at concentrations that are substantially the same as those in the primary electrolyte.

(3) At least one of the components in the secondary electrolyte has a significantly different concentration than the primary electrolyte's target concentration. In an acid-copper plating system for example, the target concentration of copper ion in the primary electrolyte may be about 2 g/l, and the concentration of copper ion in the secondary electrolyte may be about 40 g/l. In an acid-cobalt plating system for example, the target concentration of borate ion in the primary electrolyte may be about 33 g/l, while the concentration of borate ion in the secondary electrolyte may be about 45 g/l (e.g., the solubility limit of borate).

Figure 6C:
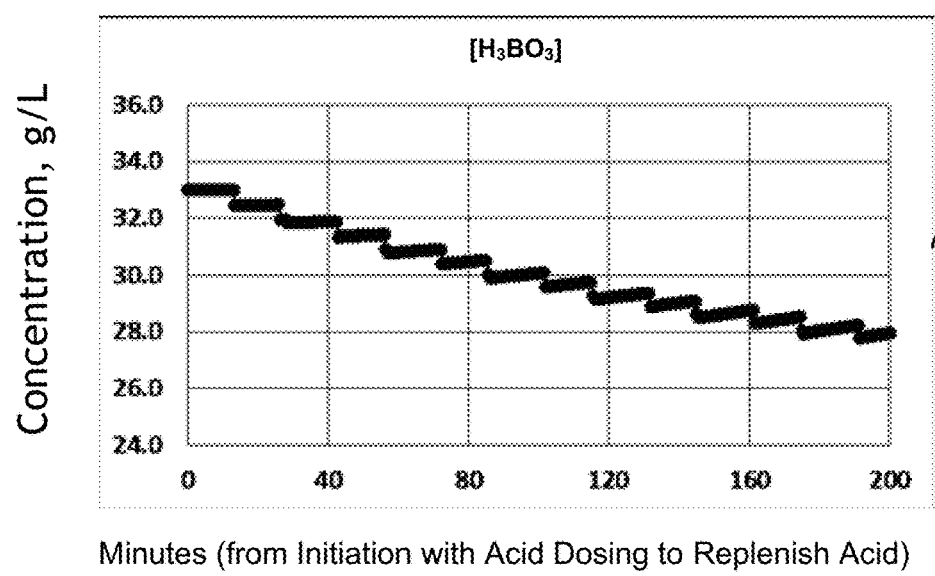

(4) The component(s) of the secondary electrolyte that is (are) significantly different in concentration are the same component(s) in the primary electrolyte which would experience the most drift in composition or concentration, given a normal processing without using a secondary electrolyte, e.g., copper ion and acid in FIGS. 3A-3D and borate ion in FIG. 6C. In some cases, particularly those involving a significant acid/metal ion partition effect, a significant drift is transient (i.e., it occurs only temporarily and is not permanent). See FIGS. 3B-3D. For example, the drift may only be significant upon starting operation after replacing much or all of the electrolyte solution. As an example, the transient drift may exist for a duration corresponding to plating on about 300-1,000 wafers, or over the course of approximately one day. In some implementations, it is only during the transient period of significant drift that the secondary electrolyte need be employed.

(5) Depending on the direction of the drift in a component's concentration in the primary electrolyte during usage, the concentration of the component in the secondary electrolyte is significantly higher or lower in concentration. For example, given the acid concentration's positive "drift" in the catholyte shown in FIG. 3D, a secondary electrolyte may include a significantly reduced concentration of acid. The concept of "drift," as understood in the art and referred to herein may be considered a perturbation from a target concentration value. For example, a drift may be a perturbation of more than about 2-3% from a specified target value. In another example, given the copper ion concentration's negative drift in the catholyte shown in FIG. 3C, a secondary electrolyte may include a significantly increased concentration of copper ion. In still another example, given the borate concentration's negative drift in the catholyte shown in FIG. 6C, a secondary electrolyte may include a significantly increased concentration of borate ion.

(6) The volume usage of the secondary electrolyte may be relatively insignificant when compared to the volume of the central plating bath (primary electroplating solution) or the reservoir holding that bath, e.g., reservoir 150 shown in FIGS. 1, 7, 9, 11A, and 12. This has the benefit reducing reliance on consumable ingredients and thus may allow for designs or configurations that do not increase, or not significantly increase, the footprint of the plating apparatus. In an example, the amount of secondary electrolyte used in one day of continuous plating operation (e.g., to plate about 1,000 wafers) is no more than 5% of the volume of the electroplating solution reservoir.

(7) Use of the secondary electrolyte may significantly reduce the required bleed and feed rate to maintain the primary electrolyte in control specification. The amount of reduction in the bleed and feed rate depends on the particular plating system application. In an instance where make-up solution has a cupric ion concentration of about 2 g/l, the bleed and feed rate required to control copper ion concentration to within 5% to target may be greater than about 150%. For the same applications but with the use of a secondary electroplating solution as described herein, the bleed and feed rate may be reduced to only 15%, and yet have similar, or even better, control over copper concentration in the solution. A bleed and feed rate refers to the fraction of fluid volume in the electroplating solution reservoir that is replaced (bled off or fed in) during one day of continuous electroplating. For example, if the reservoir holds 150 L of electroplating solution, a bleed and feed rate of 15% requires replacement of 22.5 L of electroplating solution during a day of continuous electroplating.

(8) Additions of the secondary electrolyte to the primary electrolyte, or to the auxiliary cathode chamber, are based on primary electrolyte composition, and may not always be needed. For example, secondary electrolyte additions may not always be needed outside of transient concentration deviations due to results of the acid/metal ion partition effect.

(9) In certain embodiments, the secondary electrolyte may be supplied to the plating apparatus through a small container attached to the plating apparatus. Moreover, in certain embodiments, supplying the secondary electrolyte is done through a bulk facility supply (e.g., a source that is available to multiple tools in a fabrication facility, and may be plumbed through the facility).

(10) In some embodiments, the secondary electrolyte is introduced to the main electroplating solution reservoir. Also, in certain embodiments, the secondary electrolyte is introduced to the cathode chamber of a plating cell and/or to an auxiliary cathode chamber of the plating cell. In some applications, the secondary electrolyte is introduced to the anode chamber of a plating cell. This latter application may help maintain the cathode side electrolyte concentration to specification. Various orientations and/or configurations of the supply of secondary electrolyte to various components of the electrolyte management system 100, shown in FIG. 1, are shown in FIGS. 7, 9, 11A, and 12 and will be described in further detail below.

When specifying concentration values, "substantially the same" means within about +/−5% from a specified target value. For example, a concentration that is substantially the same as 2 g/l may be within a range of about 1.9 to 2.1 g/l. Unless otherwise noted when specifying concentration values, "significantly deviate from," "is significantly different than," and the like mean that the more concentrated component has a concentration that is between about 1.3 times and 50 times the concentration of the less concentrated component. In some cases, the concentration difference of a component in (a) a secondary electroplating solution and (b) a primary electroplating solution or a make up solution, is between about 5 to 50 times. For example, the concentration of component A is about 5 to 50 times greater in the secondary electroplating solution than in the primary electroplating solution, or vice versa. In another example, the concentration of component A is about 5 to 20 times greater in the secondary electroplating solution than in the primary electroplating solution, or vice versa. In yet another example, the concentration of component A is about 15 to 30 times greater in the secondary electroplating solution than in the primary electroplating solution, or vice versa.

As described previously, component concentration drift in a plating electrolyte may be common. This is especially true for a plating apparatus with separate anodic and cathodic portions, but may not be necessarily tied to that kind of design. To maintain both catholyte and anolyte concentration to acceptable level to ensure acceptable electrochemical plating performance, a general approach in controlling the electrolyte concentration is to adopt a high electrolyte replenish (e.g., "bleed and feed") rate. However, doing so may increase operational costs of running plating processes significantly, and sometimes make the plating process prohibitively expensive. In addition, in some cases, application and/or usage of a high bleed and feed rate alone may not adequately address the electrochemical plating performance related problems. A second approach that could be used is to have separate dosing for each and every component in the electrolyte. However, doing so could make the dosing algorithm extremely complicated. Additionally, dosing of every component to the plating electrolyte would generate a diluting effect to all other components in the plating electrolyte. Thus, the plating apparatus could end up being in dosing/calculating status all the time. Accordingly, this approach is generally avoided.

By adopting a "complementary" secondary electroplating solution, the replenish rate could be significantly reduced, while the concentration drift in the primary plating electrolyte could be significantly reduced. By designing the secondary electrolyte properly, the usage of secondary electrolyte could be minimized so that adopting secondary electrolyte would not contribute toward substantial additional costs to setting up and running the plating apparatus.

Example (1)—Copper Electroplating

Cu-like plating process, where Cu plating current efficiency is high (close to 100%), and where there is a strong acid metal ion partition effect in the anodic electrolyte. As described in the previous sections and shown in FIG. 2 and FIGS. 3A through 3D, a potential issue with this plating process is acid drifting low and Cu concentration drifting high in the anodic portion, and acid drifting high and Cu drifting low in the cathodic portion. In certain embodiments, the copper electroplating solution includes copper sulfate, sulfuric acid, chloride ions, organic additives, and deionized (DI) water as needed. Typical concentration ranges for such components include about 1-25 g/l Cu ion, about 10-175 g/l acid, about 40-100 ppm chloride ion, and about 20-400 ppm additives. In certain embodiments, a low concentration copper electroplating solution is used; i.e., a solution having about 10 g/l Cu ion or less and about 5-50 g/l acid. In certain embodiments, a low concentration copper electroplating solution contains about 4-10 g/l Cu ions and about 5-20 g/l acid.

Figure 7:
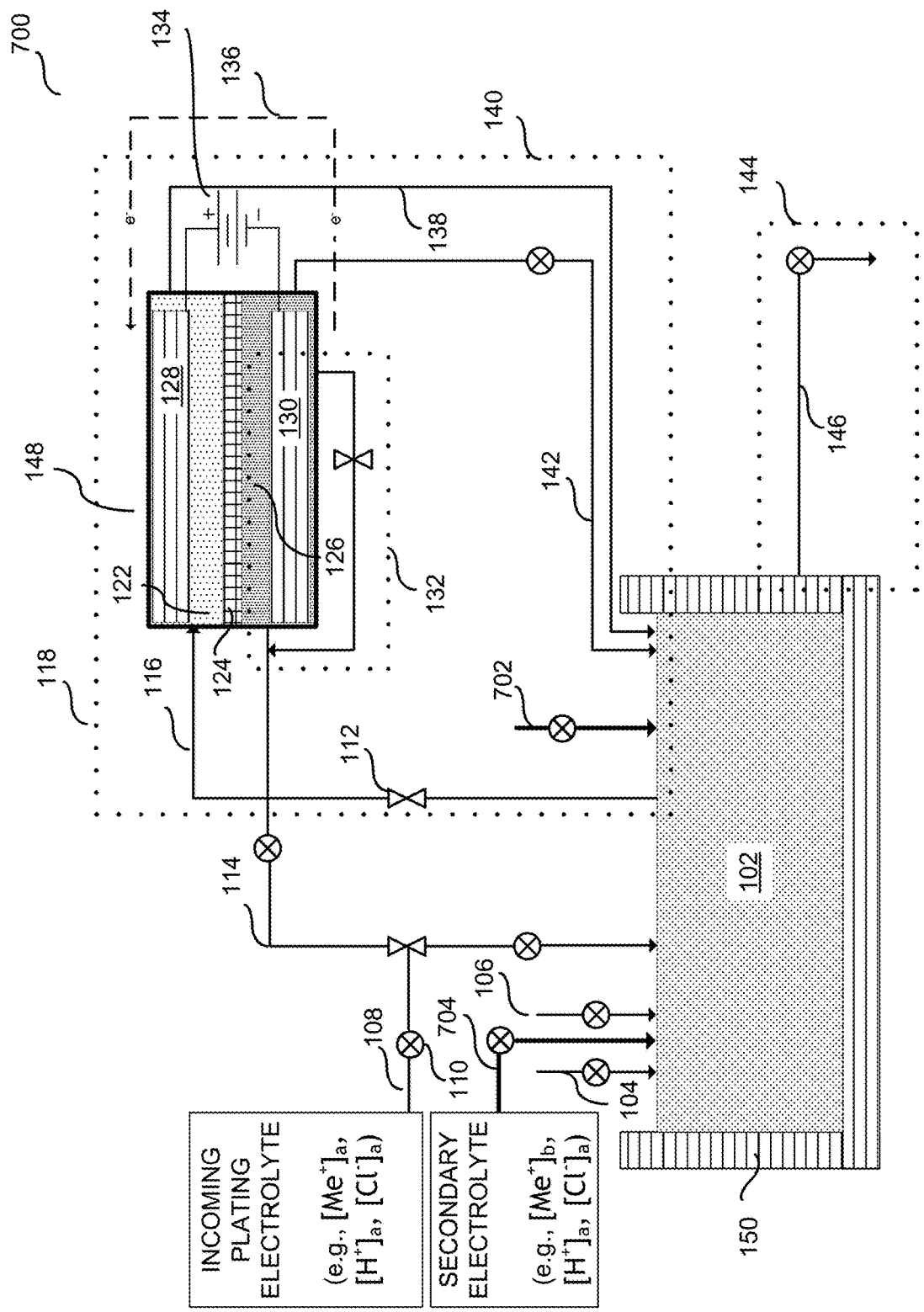
FIG. 7 shows a configuration of the electroplating system shown in FIG. 1 with the introduction of a secondary electrolyte, or electroplating solution, for copper (Cu) plating.

FIG. 7 illustrates a plating electrolyte concentration control scheme with secondary electrolyte. Like reference numerals refer to like elements, thus a redundant description of the same will be omitted. Building upon that described in detail for system 100 shown in FIG. 1, system 700 further may be configured to include delivery of incoming plating electrolyte, which now may include metal ions of a first defined concentration level, denoted by $[Me^+]_a$, acid, e.g., ionized and/or hydrogen ions shown by $[H^+]_a$, and chloride ions, shown by $[Cl^-]_a$. Unlike system 100, system 700 shown by FIG. 7 has an additional line 704 feeding, or otherwise supplying, secondary electrolyte, e.g., to compensate for undesirable plating solution concentration fluctuation on the cathodic side 122, and/or the anodic side 126. The secondary electrolyte may include metal ions of a second defined concentration level, different from the first defined concentration level, denoted by $[Me^+]_b$, and may otherwise have the original concentration levels of acid as the incoming plating electrolyte, e.g., hydrogen ions shown by $[H^+]_a$, and chloride ions, shown by $[Cl^-]_a$. In the depicted embodiment, secondary electrolyte is supplied to bath 102 contained in reservoir 150.

In one implementation, the secondary electrolyte is designed to have significantly higher [Me+] (e.g., $Cu^{2+}$) than in the bath, while other components (e.g., acid, $Cl^-$) remain of the same concentration. The plating electrolyte concentration could be maintained by dosing secondary electrolyte when [Me+] in cathodic side drifts low, doing so will bring [Me+] up to target without impacting other components; dosing DI when $[H^+]$ in the cathodic portion drift high, and add secondary electrolyte to maintain the [Me+] concentration, if needed. As an example, the make-up solution includes about 1-5 g/l copper ion, about 5-20 g/l acid, and about 40-80 ppm chloride ion, while the secondary electroplating solution includes about 30-80 g/l copper ion, about 5-20 g/l acid, and about 40-80 ppm chloride ion. Either or both of the make up solution and the secondary electroplating solution optionally include one or more organic plating additives.

In another implementation, the secondary electrolyte could be designed to have significantly higher [Me+] concentration, yet slightly higher concentration in $[Cl^-]$, and slightly lower concentration in [W]. For example, assuming a target electroplating solution of about 1-25 g/l Cu ion, about 10-175 g/l acid, about 40-100 ppm chloride ion, and about 20-400 ppm additives, the secondary electroplating solution may have a concentration in the range of about 20-70 g/l copper ion, about 8-10 g/l acid, and about 50-100 ppm chloride ion.

In yet another embodiment, the secondary electrolyte could be designed to be metal sulfate ($CuSO_4$) solid powder. In that case, a very small amount of powder addition to the bath would bring anion concentration back to target, yet it will not cause plating bath volume change so it will not impact the concentration levels of the other components.

Figure 8A:
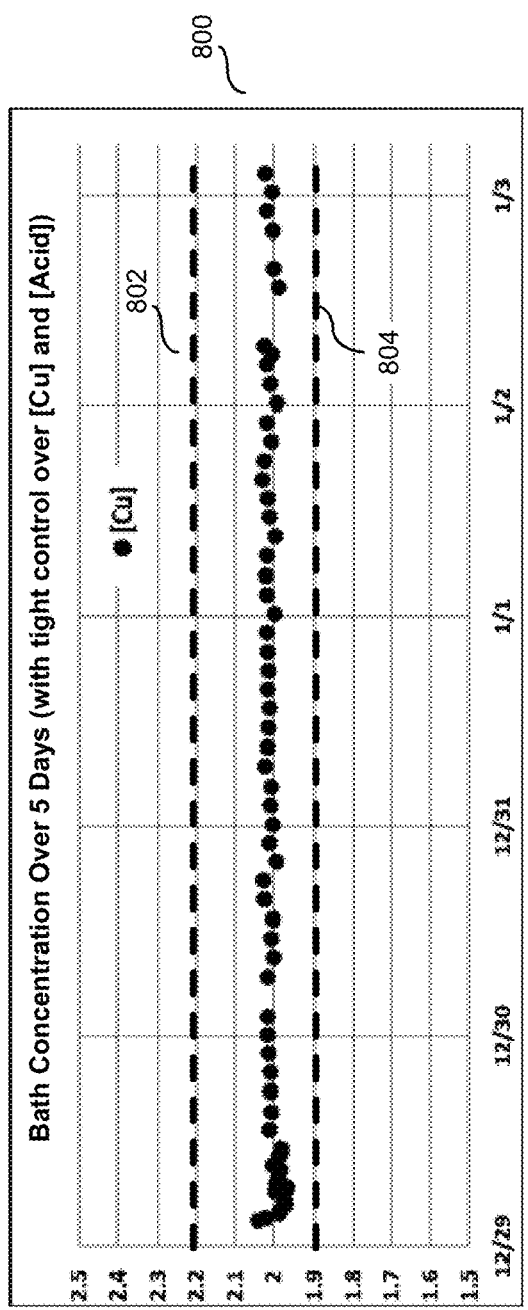
FIGS. 8A-8B show various graphs illustrating bath concentration results with secondary make-up solution (MS) dosing for copper (Cu) plating electrolyte.
Figure 8B:
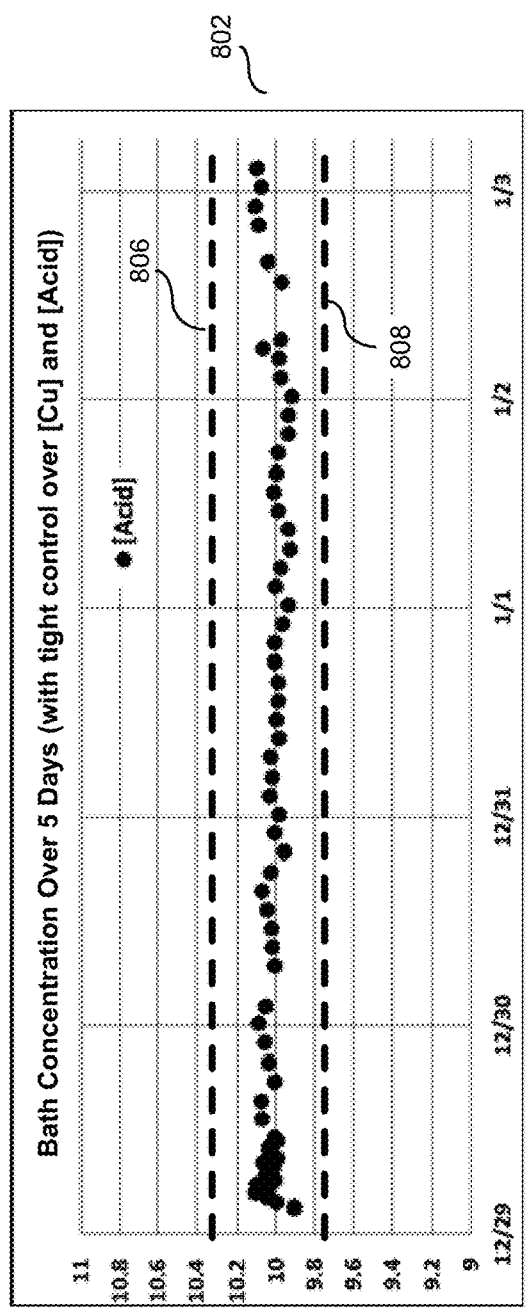

FIGS. 8A and 8B show typical $[Cu^{2+}]$ and acid concentration trends, respectively, in a plating electrolyte on a plating apparatus that has adopted secondary electrolyte. This shows significant improvement in $[Cu^{2+}]$ and acid concentration drift.

Example (2)—Cobalt Electroplating

Figure 5A:
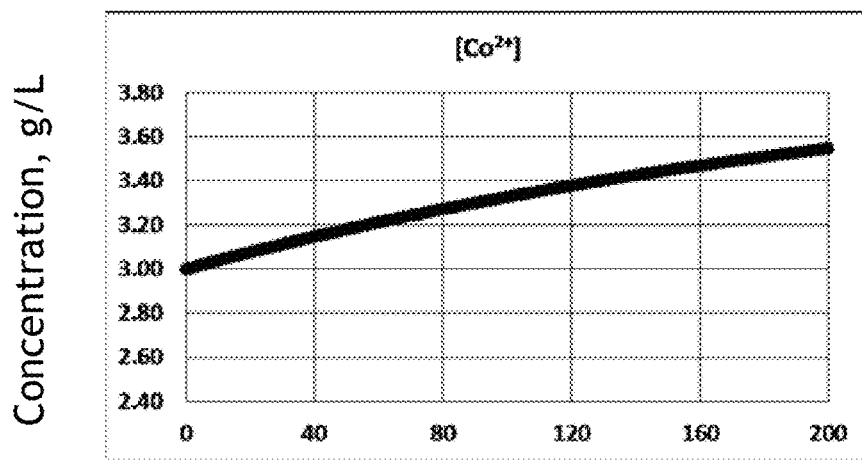
FIGS. 5A-5C show various graphs illustrating electroplating bath concentration trends without the introduction of a supplemental, or secondary, electroplating solution to the system for that shown in FIG. 4.
Figure 5B:
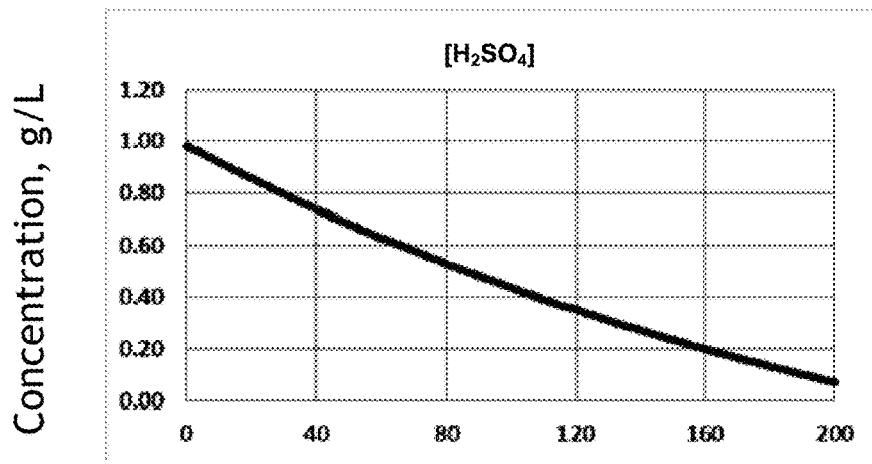
Figure 5C:
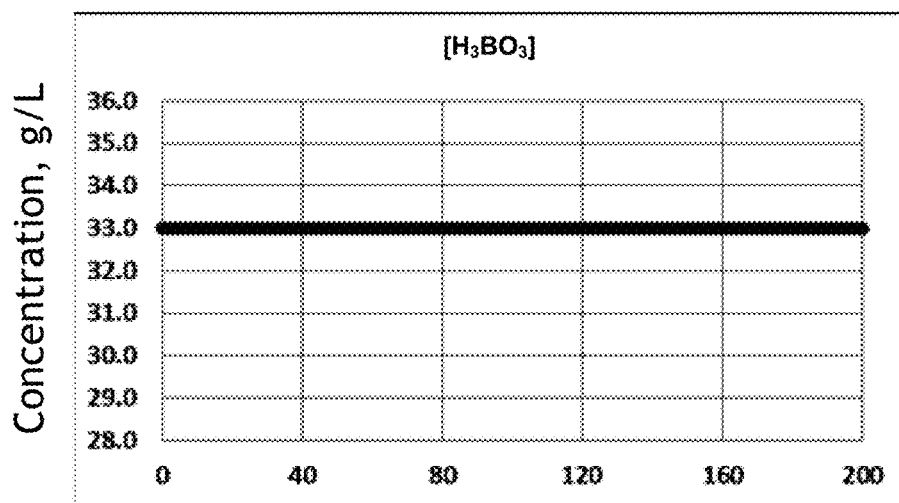
Figure 9:
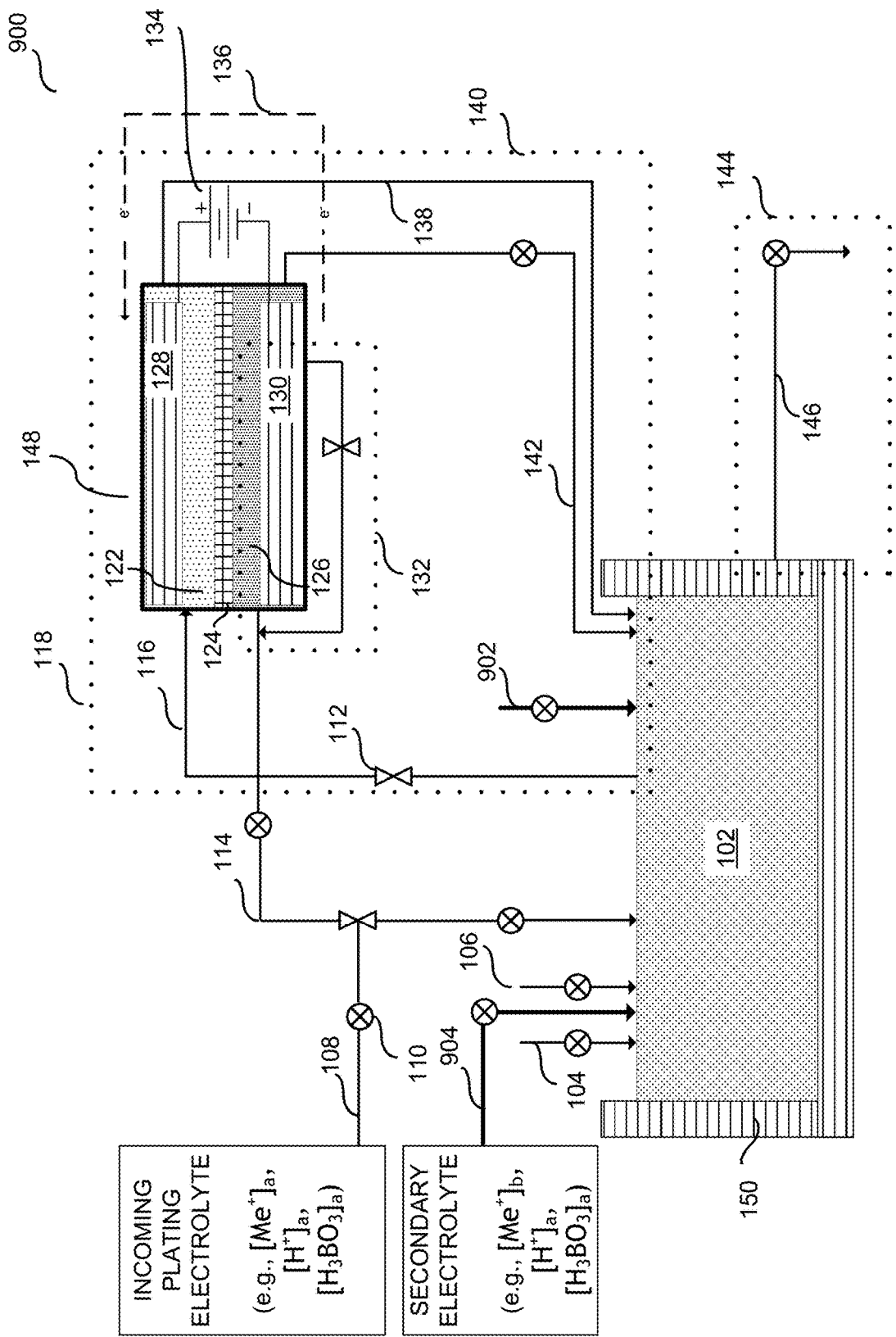
FIG. 9 shows a configuration of the electroplating system shown in FIG. 1 with the introduction of a secondary electrolyte, or electroplating solution, for cobalt (Co) plating.

Plating processes for electroplating cobalt onto a wafer, where acid/metal ion partition effect in the anodic side is not significant, and where metal plating current efficiency is <100%, are shown in detail by system 900 in FIG. 9. Over long term of plating, $Co^{2+}$ concentration may drift high, while acid ($H_2SO_4$) concentration drift low over time, with boric acid concentration remaining relatively stable. See FIGS. 5A-5C. As illustrated in FIG. 5A and FIG. 6C, depending on the control algorithm used on the plating apparatus, with acid dosing enabled, the end results could be either $Co^{2+}$ concentration getting too high (if $Co^{2+}$ is not controlled) over time, or $H_3BO_3$ concentration drifting low (if $Co^{2+}$ concentration is controlled with DI addition). FIG. 9 illustrates a plating electrolyte control schematic on a Co plating apparatus. In certain embodiments, the cobalt electroplating solution includes cobalt sulfate, sulfuric acid, boric acid, organic additives, and deionized water as needed. Typical concentration ranges for such components include about 2-40 ($Co^{2+}$)g/l, about 10-40 g ($H_3BO_3$)/l (boric acid), about 0.01-0.1 g ($H_2SO_4$)/l (e.g., sulfuric acid), and about 20-400 ppm organic plating additives.

Similar to that introduced for system 700 shown by FIG. 7, system 900, which may be used for plating cobalt, may include the delivery of a secondary electrolyte via line 904 to bath 102. Like reference numerals refer to like elements, thus a redundant description of the same will be omitted. In system 900, both the incoming plating electrolyte and the secondary electrolyte may include boric acid, e.g., $H_3BO_3$, as a constituent in solution, sometimes used in place of $Cl^-$ in cobalt plating solutions. In the depicted embodiment, the make-up solution provided via line 108 includes metal ion (e.g., cobalt ion), acid (e.g., sulfuric acid), and boric acid. In this embodiment, the secondary electrolyte is supplied to bath 102 contained in reservoir 150.

The secondary electrolyte is designed to have significantly lower $Co^{2+}$ concentration (as low as 0 g/l) yet have the same concentration of $H_3BO_3$ and acid. For example, the secondary electroplating solution may contain between 0-1 g ($Co^{2+}$)/l (e.g., cobalt ion), between about 10-40 g ($H_3BO_3$)/l (e.g., boric acid), and about 0.01-0.1 g ($H_2SO_4$)/L (e.g., sulfuric acid). In a specific example, the secondary electroplating solution contains about 0 g/l of cobalt ion, about 30 g/l boric acid, and about 0.1 g/l sulfuric acid. The plating electrolyte concentration could be maintained by dosing secondary electrolyte when [Me+] in cathodic side drift high; this will bring [Me+] down to target without impacting other components; dosing acid when [$H^+$] in the cathodic portion drift low.

The secondary electrolyte could also be designed to have significantly higher $H_3BO_3$ concentration than in the primary electrolyte. For example, the secondary electroplating solution may have between 0-1 g/l cobalt ion, between about 40-50 g/l boric acid, and about 0.01-0.1 g/l sulfuric acid. In a specific example, the secondary electroplating solution has about 3 g/l $Co^{2+}$, about 45 g/l boric acid, and about 0.1 g/l sulfuric acid. The plating electrolyte concentration could be maintained by dosing DI to the central bath when $Co^{2+}$ drift high; this will bring [$Me^+$] down to target while at the same time, diluting acid and $H_3BO_3$ concentration; the acid concentration could be compensated with acid dosing, while the $H_3BO_3$ concentration could be brought up by dosing the secondary electrolyte.

The above two approaches could be combined by adopting a secondary electrolyte with significantly lower $Co^{2+}$ concentration and significantly higher $H_3BO_3$ concentration. For example, the secondary electroplating solution may have between 0-1 g/l cobalt ion, between about 40-50 g/L boric acid, and about 0.01-0.1 g/l sulfuric acid. In a specific example, the secondary electroplating solution has about 0 g/l cobalt ion, about 45 g/l boric acid, and about 0.1 g/l sulfuric acid.

Figure 10A:
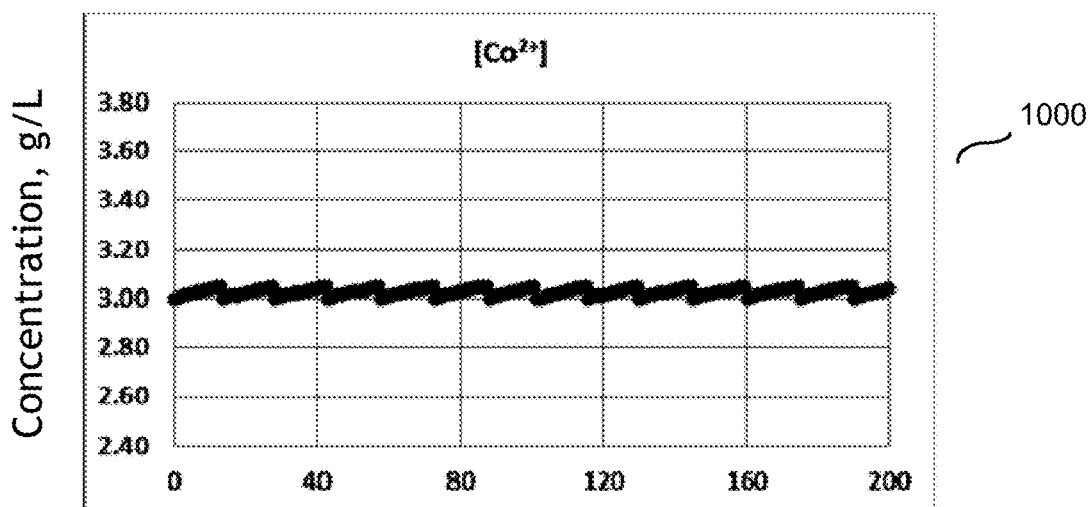
FIGS. 10A-10C show various graphs illustrating expected bath performance with secondary electrolyte dosing for cobalt (Co) plating.
Figure 10B:
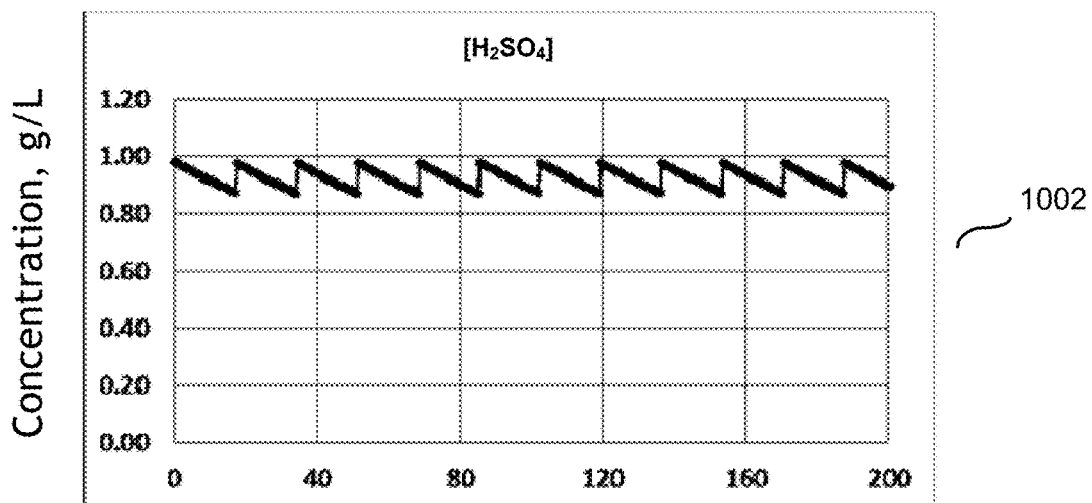
Figure 10C:
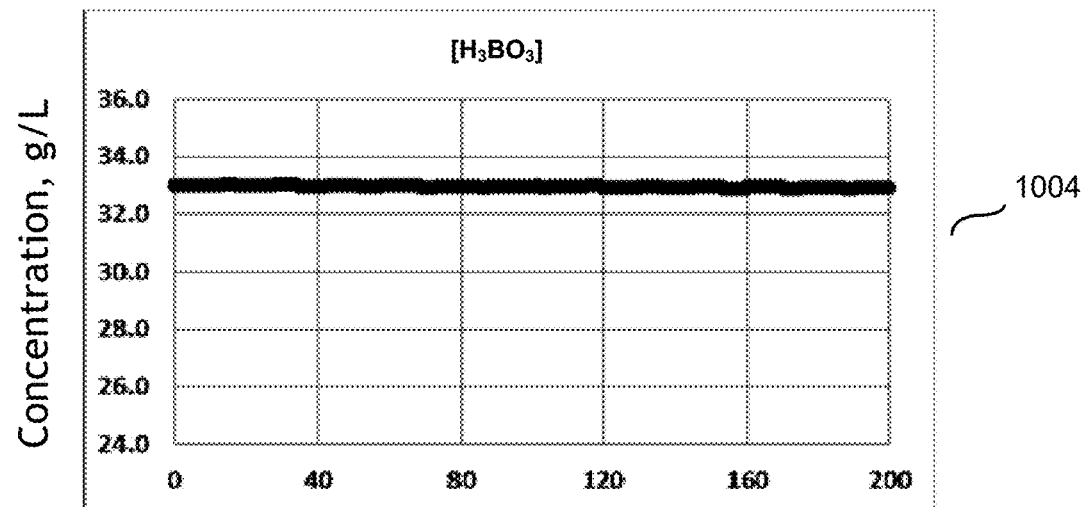

FIGS. 10A-10C illustrate how the three major components respond over time with secondary electrolyte dosing implemented on the plating apparatus with lower metal ion concentration secondary electrolyte approach as described.

Example 3— Electroplating in Systems Having an Auxiliary Electrode

Certain configurations of electroplating systems and/or apparatuses may include an auxiliary electrode chamber contained therein, or connected thereto. Such an auxiliary electrode chamber may be controlled locally, or centrally.

Figure 11A:
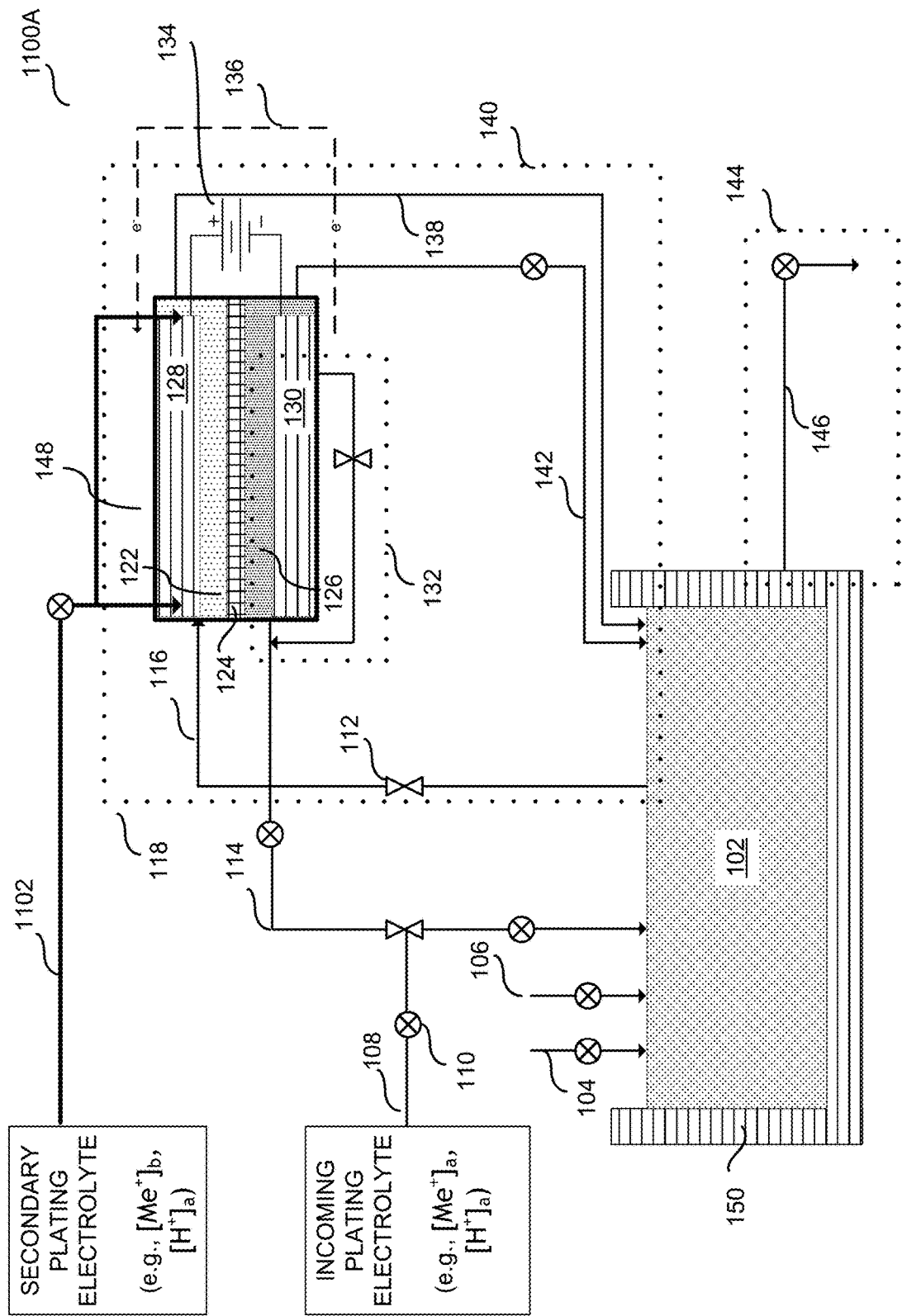
FIG. 11A shows a configuration of the electroplating system shown in FIG. 1 with the introduction of a secondary electrolyte, or electroplating solution, into the cathode side of the electroplating cell.

As described in previous sections, it is common for a plating apparatus to have more than one cathode or anode chamber. At times, the concentration of the electrolyte component in the auxiliary electrode chamber needs to be different from the main cathodic solution. One such example is illustrated in FIG. 11A. In this apparatus, there is a secondary cathode that is contained in a separate chamber. The secondary cathode is added to help maintain the performance of the main cathode (wafer substrate) (to improve plating uniformity on wafer, for example). To support higher plating current capability on the dual cathode, it is desirable to have higher anion concentration in the electrolyte than in the main cathodic solution, yet the usage of the secondary electrolyte is not significant. Adding a secondary electrolyte source through a bottle (or through facility supply) with significantly high anion concentration would help significantly increase the dual cathode current capability since the current the electrolyte could support without gas evolution is directly proportional to the concentration of the anion in the electrolyte. The actual electrolyte to be used in the secondary cathodic chamber could be secondary electrolyte itself, or could be a mixture of secondary electrolyte with the primary electrolyte, depending on the needs of secondary cathode plating current.

In one example, the primary electroplating solution contains about 1-5 g/l copper ion, while the secondary electroplating solution, which is provided to one or more auxiliary cathodes contains about 30-70 g/l copper ion. This may increase DC current capability in the auxiliary cathodes by about 6-70 times.

Figure 11B:
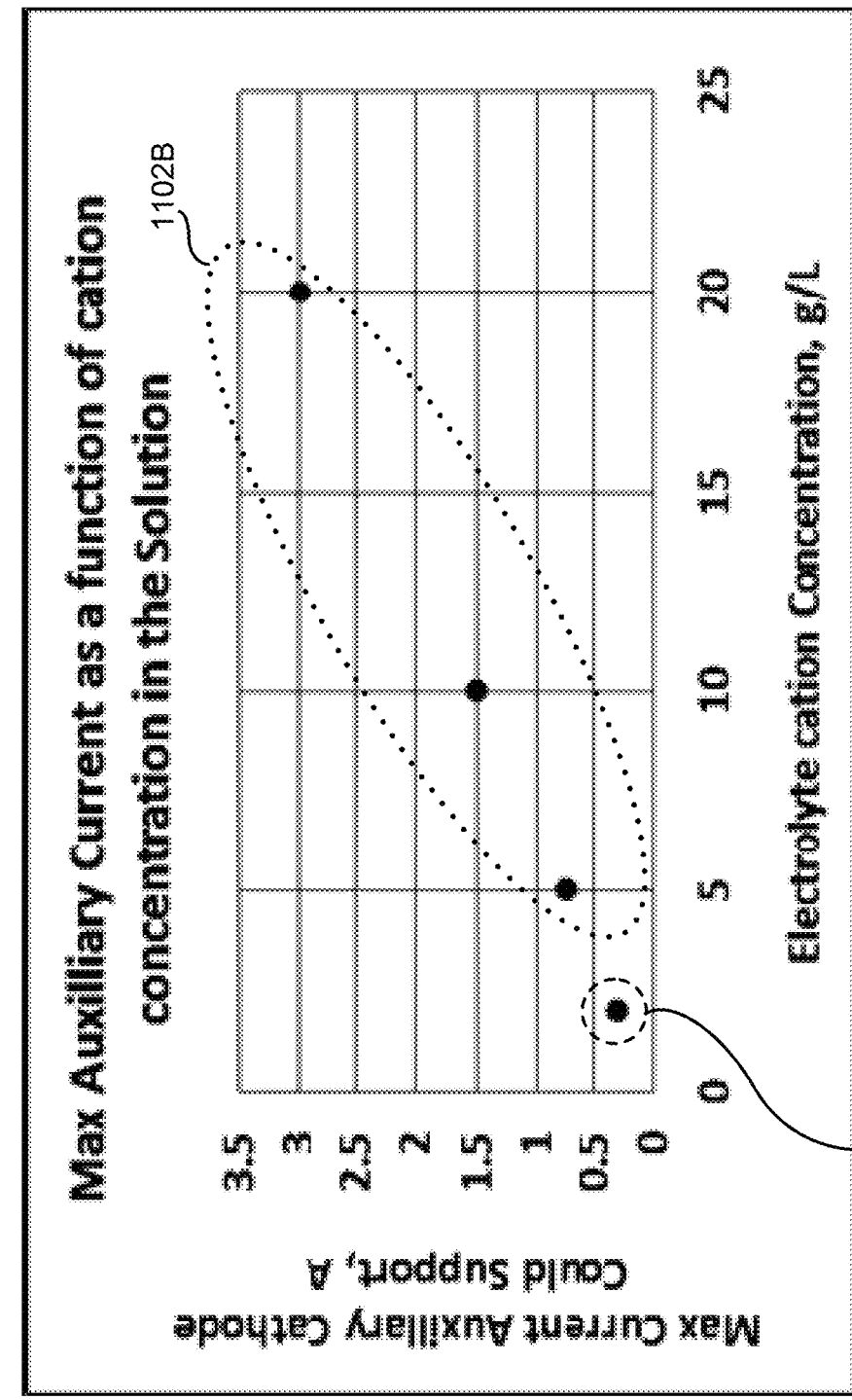
FIG. 11B shows a graph of auxiliary current as a function of cation concentration in electroplating solution.

System 1100A, shown by FIG. 11A, likewise builds upon that introduced by system 100 shown by FIG. 1 earlier. Like reference numerals refer to like elements, thus a redundant description of the same will be omitted. Secondary plating electrolyte is delivered, or flowed, via line 1102 into the cathodic side 122. In certain embodiments, solution contained in the auxiliary cathode may be the secondary plating electrolyte alone, or a mixture of the secondary plating electrolyte and the incoming plating electrolyte depending on the particular needs of a given application. FIG. 11B shows graph 1100B of the maximum auxiliary current as a function of cation concentration in the solution. Graph 1100B includes data generated with secondary electrolyte dosing of various concentration levels, e.g., shown by area 1102B, as well as a baseline data value without secondary electrolyte, e.g. show by area 1104B.

Example (4)—Cobalt Electroplating with Secondary Electrolyte to Cathode Chamber

The cathode electrolyte concentration on a plating apparatus may be controlled by adopting secondary electrolyte on the anode side, e.g., flowing secondary electrolyte directly into the anode chamber. As previous described, one potential problem with the mass/charge balance in a Co-like plating system is that more metal ion is released from the anode to the plating electrolyte than pulled out of the electrolyte by plating onto the cathode; while hydrogen ions are consumed without being replenished on the cathode side. Thus over time, metal ion concentration drift up, and acid concentration drift down.

By introducing into the anode chamber a secondary electrolyte with higher acid, and low or zero metal ion concentration, the system may utilize the selectivity of the cation exchange membrane in transferring hydrogen ions and metal ions to let more hydrogen ion passing the membrane to replenish acid (which was consumed during plating process), and let less metal ion pass through the membrane to avoid accumulation. In this way, provision of the secondary electrolyte to the anode chamber helps to balance the metal ion and hydrogen ion consumption and generation/adding rate in the cathode side.

In some embodiments, the primary electroplating solution contains about 2-40 g/L cobalt ion, about 10-40 g/l boric acid, about 0.01-0.1 g/l sulfuric acid, and about 20-400 ppm additives (e.g., about 3 g/l cobalt ion, about 0.1 g/l sulfuric acid, and about 30 g/l boric acid). In such embodiments, the secondary electroplating solution may contain about 0-1 g/l cobalt ion, about 0.1-0.5 g/l sulfuric acid, and about 0-40 g/l boric acid (e.g., about 0 g/l cobalt ion, about 2 g/l sulfuric acid, and about 30 g/l boric acid).

Figure 12:
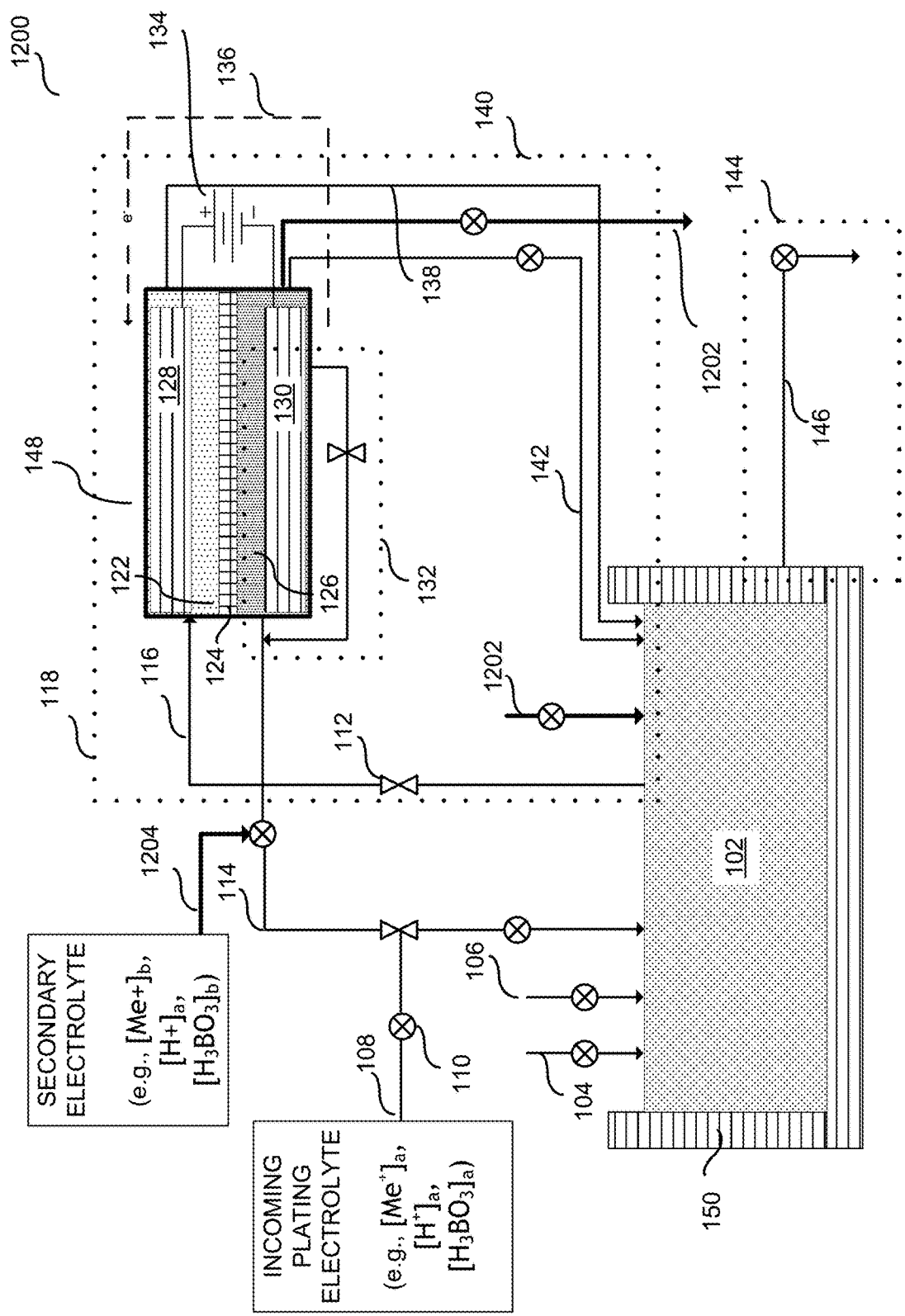
FIG. 12 shows a configuration of the electroplating system shown in FIG. 1 with the introduction of a secondary electrolyte, or electroplating solution, into the anode side of the electroplating cell.

As may result from operating a system 1200 shown in FIG. 12, the concentrations of all components contained within the primary electroplating solution and the cathode chamber may be stable over long-term. Likewise, the anode side solution concentrations may also stabilize over time to a level that is different from the target concentrations, due to the addition of secondary electrolyte with a significantly higher acid content.

Figure 13A:
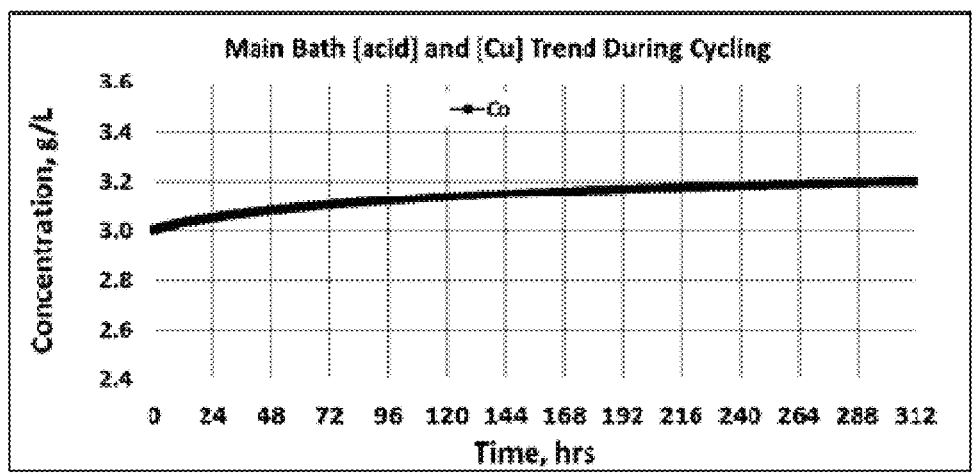
FIGS. 13A-13E show various graphs illustrating primary electroplating solution and anolyte concentration trends for dosing cobalt ($Co^{2+}$) to the anode chamber of the electroplating cell.
Figure 13B:
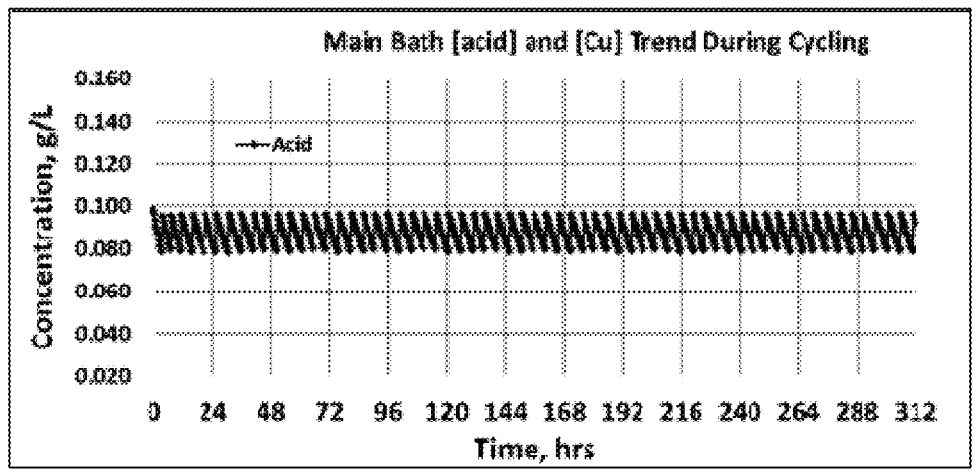
Figure 13C:
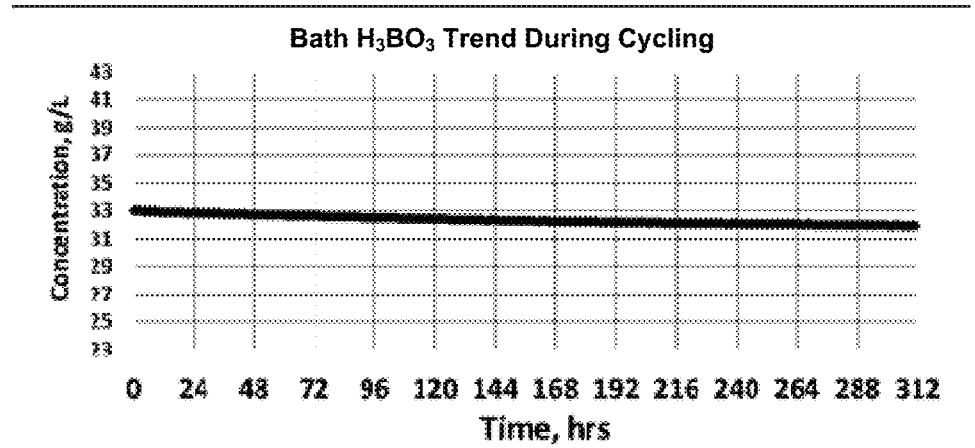
Figure 13D:
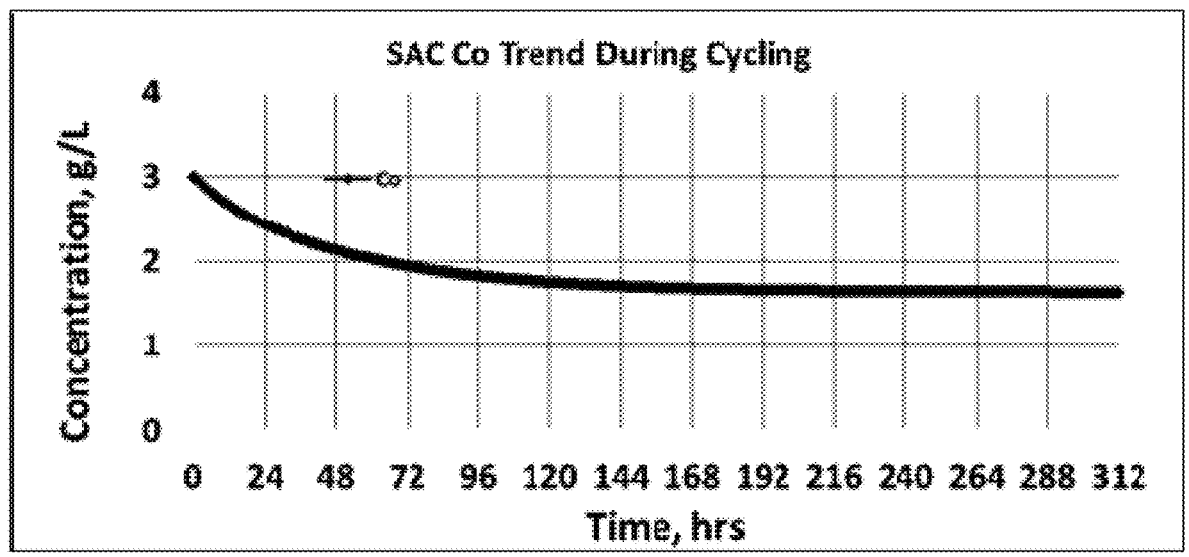
Figure 13E:
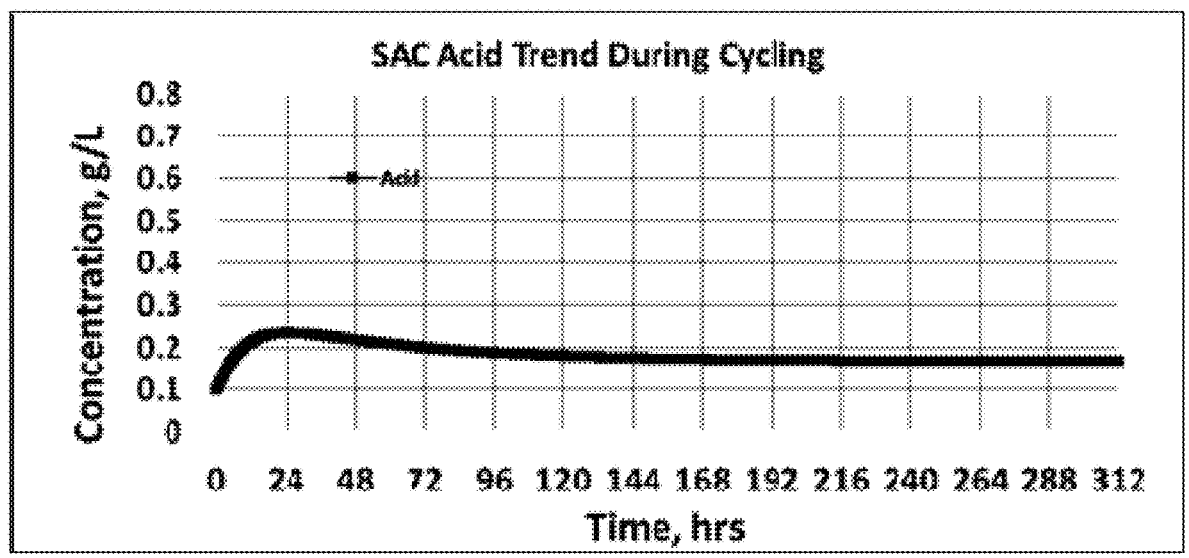

FIGS. 13A-13C illustrate generally stable concentrations of cobalt ion, sulfuric acid, and boric acid in the primary electroplating solution of a cobalt plating system employing direct anode chamber injection of a secondary electroplating solution as illustrated in FIG. 12. FIGS. 13D and 13E illustrate generally stable concentrations of cobalt ion and sulfuric acid in the anolyte of the cobalt plating system employing direct anode chamber injection of a secondary electroplating solution as illustrated in FIG. 12. Note that "SAC" in the figures refers to the anode chamber (separated anode chamber).

While similar to the other systems discussed earlier, system 1200 varies from system 100 in flowing secondary electrolyte directly to the anode chamber 126 to assist with stabilizing electroplating solution compositions. Note that systems employing direct anode chamber introduction of secondary electroplating solution are not limited to cobalt plating; they can in some cases be used for plating other metals.

Apparatus

Many apparatus configurations may be used in accordance with the embodiments described herein. One example apparatus includes a clamshell fixture that seals a wafer's backside away from the plating solution while allowing plating to proceed on the wafer's face. The clamshell fixture may support the wafer, for example, via a seal placed over the bevel of the wafer, or by means such as a vacuum applied to the back of a wafer in conjunction with seals applied near the bevel.

The clamshell fixture should enter the bath in a way that allows good wetting of the wafer's plating surface. The quality of substrate wetting is affected by multiple variables including, but not limited to, clamshell rotation speed, vertical entry speed, and the angle of the clamshell relative to the surface of the plating bath. These variables and their effects are further discussed in U.S. Pat. No. 6,551,487, incorporated by reference herein. In certain implementations, the electrode rotation rate is between about 5-125 RPM, the vertical entry speed is between about 5-300 mm/s, and the angle of the clamshell relative to the surface of the plating bath is between about 1-10 degrees. One of the goals in optimizing these variables for a particular application is to achieve good wetting by fully displacing air from the wafer surface.

Figure 14:
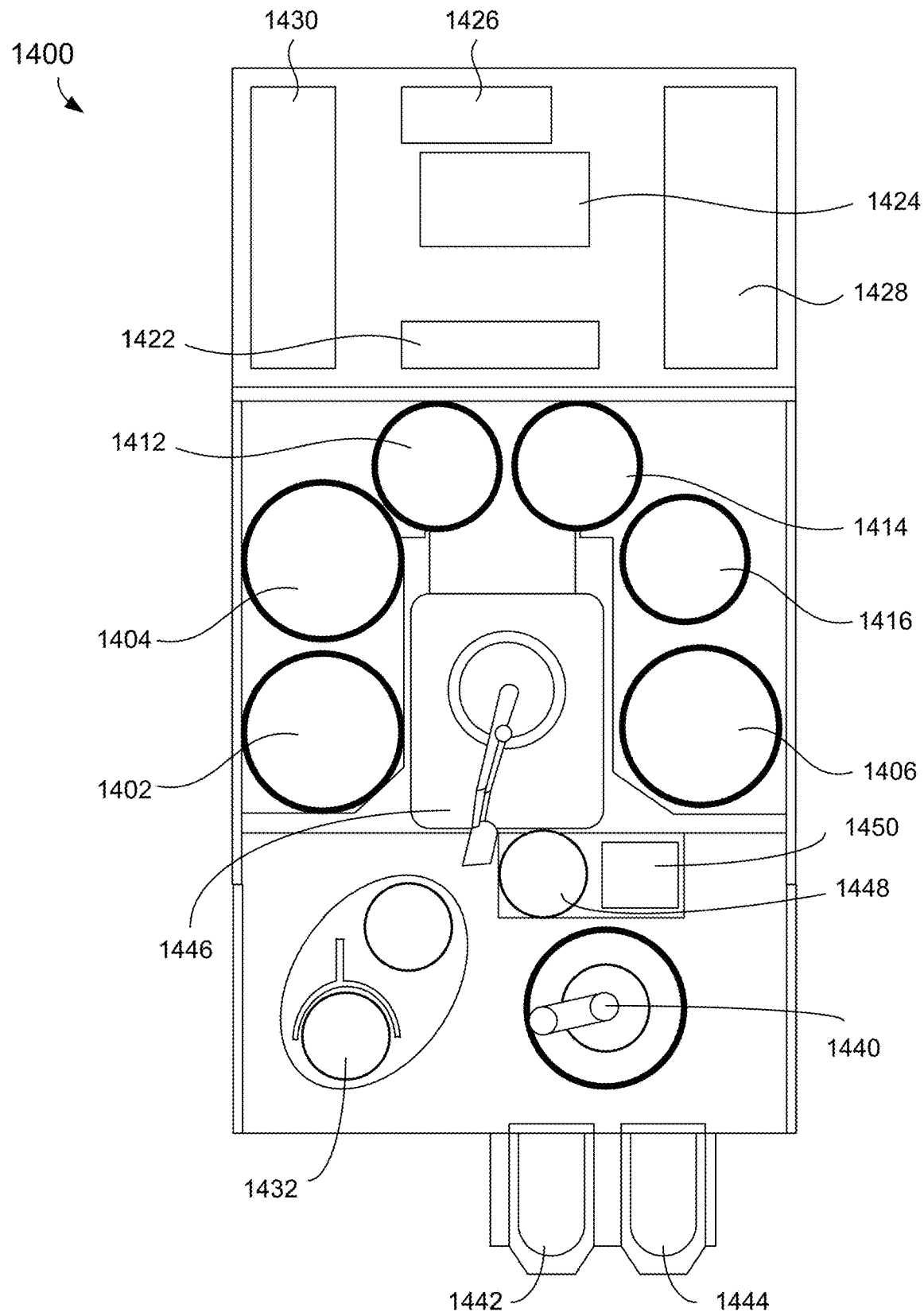
FIG. 14 shows a schematic of a top view of an example electrodeposition apparatus.

The electrodeposition methods disclosed herein can be described in reference to, and may be employed in the context of, various electroplating tool apparatuses. One example of a plating apparatus that may be used according to the embodiments herein is the Lam Research Sabre tool. Electrodeposition, including substrate immersion, and other methods disclosed herein can be performed in components that form a larger electrodeposition apparatus. FIG. 14 shows a schematic of a top view of an example electrodeposition apparatus. The electrodeposition apparatus 1400 can include three separate electroplating modules 1402, 1404, and 1406. The electrodeposition apparatus 1400 can also include three separate modules 1412, 1414, and 1416 configured for various process operations. For example, in some embodiments, one or more of modules 1412, 1414, and 1416 may be a spin rinse drying (SRD) module. In other embodiments, one or more of the modules 1412, 1414, and 1416 may be post-electrofill modules (PEMs), each configured to perform a function, such as edge bevel removal, backside etching, and acid cleaning of substrates after they have been processed by one of the electroplating modules 1402, 1404, and 1406.

The electrodeposition apparatus 1400 includes a central electrodeposition chamber 1424. The central electrodeposition chamber 1424 is a chamber that holds the chemical solution used as the electroplating solution in the electroplating modules 1402, 1404, and 1406. The electrodeposition apparatus 1400 also includes a dosing system 1426 that may store and deliver additives for the electroplating solution. A chemical dilution module 1422 may store and mix chemicals to be used as an etchant. A filtration and pumping unit 1428 may filter the electroplating solution for the central electrodeposition chamber 1424 and pump it to the electroplating modules.

A system controller 1430 provides electronic and interface controls required to operate the electrodeposition apparatus 1400. The system controller 1430 (which may include one or more physical or logical controllers) controls some or all of the properties of the electroplating apparatus 1400. The system controller 1430 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 1430 or they may be provided over a network. In certain embodiments, the system controller 1430 executes system control software.

The system logic (e.g., control software) in the electrodeposition apparatus 1400 may include instructions for controlling the timing, mixture of electrolyte components (including the concentration of one or more electrolyte components), inlet pressure, plating cell pressure, plating cell temperature, substrate temperature, current and potential applied to the substrate and any other electrodes, substrate position, substrate rotation, and other parameters of a particular process performed by the electrodeposition apparatus 1400. The system control logic may also include instructions for electroplating under conditions that are tailored to be appropriate for a low copper concentration electrolyte. For example, the system control logic may be configured to provide a relatively low current density during the bottom-up fill stage and/or a higher current density during the overburden stage. The control logic may also be configured to provide certain levels of mass transfer to the wafer surface during plating. For example, the control logic may be configured to control the flow of electrolyte to ensure sufficient mass transfer to the wafer during plating such that the substrate does not encounter depleted copper conditions. In certain embodiments the control logic may operate to provide different levels of mass transfer at different stages of the plating process (e.g., higher mass transfer during the bottom-up fill stage than during the overburden stage, or lower mass transfer during the bottom-up fill stage than during the overburden stage). Further, the system control logic may be configured to maintain the concentration of one or more electrolyte components within any of the ranges disclosed herein. As a particular example, the system control logic may be designed or configured to maintain the concentration of copper cations between about 1-10 g/l. System control logic may be configured in any suitable way. For example, various process tool component sub-routines or control objects may be written to control operation of the process tool components used to carry out various process tool processes. System control software may be coded in any suitable computer readable programming language. The logic may also be implemented as hardware in a programmable logic device (e.g., an FPGA), an ASIC, or other appropriate vehicle.

In some embodiments, system control logic includes input/output control (IOC) sequencing instructions for controlling the various parameters described above. For example, each phase of an electroplating process may include one or more instructions for execution by the system controller 1430. The instructions for setting process conditions for an immersion process phase may be included in a corresponding immersion recipe phase. In some embodiments, the electroplating recipe phases may be sequentially arranged, so that all instructions for an electroplating process phase are executed concurrently with that process phase.

The control logic may be divided into various components such as programs or sections of programs in some embodiments. Examples of logic components for this purpose include a substrate positioning component, an electrolyte composition control component, a pressure control component, a heater control component, and a potential/current power supply control component.

In some embodiments, there may be a user interface associated with the system controller 1430. The user interface may include a display screen, graphical software displays of the apparatus and/or process conditions, and user input devices such as pointing devices, keyboards, touch screens, microphones, etc.

In some embodiments, parameters adjusted by the system controller 1430 may relate to process conditions. Non-limiting examples include bath conditions (temperature, composition, and flow rate), substrate position (rotation rate, linear (vertical) speed, angle from horizontal) at various stages, etc. These parameters may be provided to the user in the form of a recipe, which may be entered utilizing the user interface.

Signals for monitoring the process may be provided by analog and/or digital input connections of the system controller 1430 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

In one embodiment, the instructions can include inserting the substrate in a wafer holder, tilting the substrate, biasing the substrate during immersion, and electrodepositing a copper containing structure on a substrate.

A hand-off tool 1440 may select a substrate from a substrate cassette such as the cassette 1442 or the cassette 1444. The cassettes 1442 or 1444 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 1440 may hold the substrate using a vacuum attachment or some other attaching mechanism.

The hand-off tool 1440 may interface with a wafer handling station 1432, the cassettes 1442 or 1444, a transfer station 1450, or an aligner 1448. From the transfer station 1450, a hand-off tool 1446 may gain access to the substrate. The transfer station 1450 may be a slot or a position from and to which hand-off tools 1440 and 1446 may pass substrates without going through the aligner 1448. In some embodiments, however, to ensure that a substrate is properly aligned on the hand-off tool 1446 for precision delivery to an electroplating module, the hand-off tool 1446 may align the substrate with an aligner 1448. The hand-off tool 1446 may also deliver a substrate to one of the electroplating modules 1402, 1404, or 1406 or to one of the three separate modules 1412, 1414, and 1416 configured for various process operations.

An example of a process operation according to the methods described above may proceed as follows: (1) electrodeposit copper onto a substrate to form a copper containing structure in the electroplating module 1404; (2) rinse and dry the substrate in SRD in module 1412; and, (3) perform edge bevel removal in module 1414.

An apparatus configured to allow efficient cycling of substrates through sequential plating, rinsing, drying, and PEM process operations may be useful for implementations for use in a manufacturing environment. To accomplish this, the module 1412 can be configured as a spin rinse dryer and an edge bevel removal chamber. With such a module 1412, the substrate would only need to be transported between the electroplating module 1404 and the module 1412 for the copper plating and EBR operations.

In some implementations, a controller (e.g., system controller 1430) is part of a system, which may be part of the above-described examples. The controller may contain control logic or software and/or execute instructions provided from another source. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operations described herein, enable cleaning operations, enable endpoint measurements, metrology, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 15:
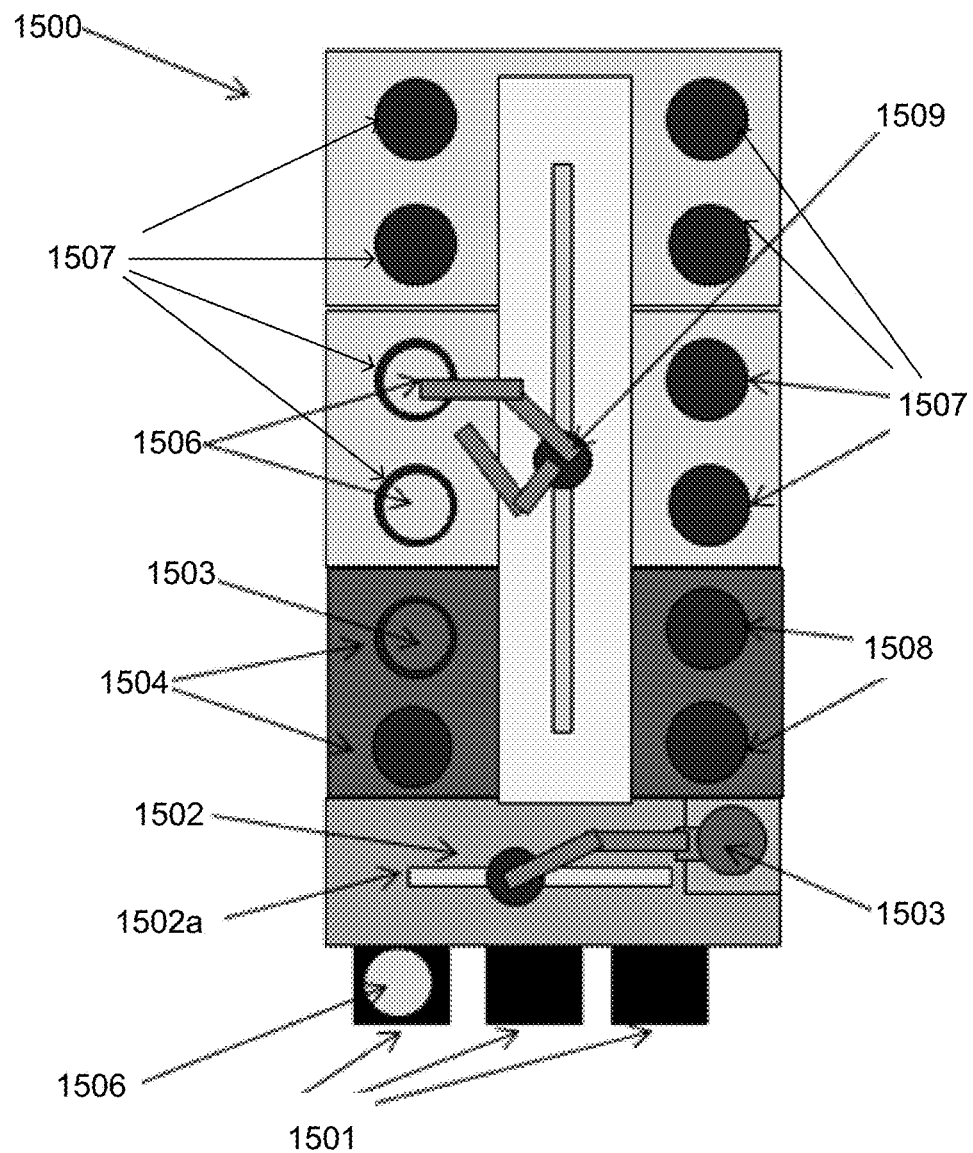
FIG. 15 shows a schematic of a top view of an alternative example electrodeposition apparatus.

An alternative embodiment of an electrodeposition apparatus 1500 is schematically illustrated in FIG. 15. In this embodiment, the electrodeposition apparatus 1500 has a set of electroplating cells 1507, each containing an electroplating bath, in a paired or multiple "duet" configuration. In addition to electroplating per se, the electrodeposition apparatus 1500 may perform a variety of other electroplating related processes and sub-steps, such as spin-rinsing, spin-drying, metal and silicon wet etching, electroless deposition, pre-wetting and pre-chemical treating, reducing, annealing, photoresist stripping, and surface pre-activation, for example. The electrodeposition apparatus 1500 is shown schematically looking top down in FIG. 15, and only a single level or "floor" is revealed in the figure, but it is to be readily understood by one having ordinary skill in the art that such an apparatus, e.g. the Lam Sabre™ 3D tool, can have two or more levels "stacked" on top of each other, each potentially having identical or different types of processing stations.

Referring once again to FIG. 15, the substrates 1506 that are to be electroplated are generally fed to the electrodeposition apparatus 1500 through a front end loading FOUP 1501 and, in this example, are brought from the FOUP to the main substrate processing area of the electrodeposition apparatus 1500 via a front-end robot 1502 that can retract and move a substrate 1506 driven by a spindle 1503 in multiple dimensions from one station to another of the accessible stations—two front-end accessible stations 1504 and also two front-end accessible stations 1508 are shown in this example. The front-end accessible stations 1504 and 1508 may include, for example, pre-treatment stations, and spin rinse drying (SRD) stations. Lateral movement from side-to-side of the front-end robot 1502 is accomplished utilizing robot track 1502*a*. Each of the substrates 1506 may be held by a cup/cone assembly (not shown) driven by a spindle 1503 connected to a motor (not shown), and the motor may be attached to a mounting bracket 1509. Also shown in this example are the four "duets" of electroplating cells 1507, for a total of eight electroplating cells 1507. The electroplating cells 1507 may be used for electroplating copper for the copper containing structure and electroplating solder material for the solder structure. A system controller (not shown) may be coupled to the electrodeposition apparatus 1500 to control some or all of the properties of the electrodeposition apparatus 1500. The system controller may be programmed or otherwise configured to execute instructions according to processes described earlier herein.

The electroplating apparatus/methods described hereinabove may be used in conjunction with lithographic patterning tools or processes, for example, for the fabrication or manufacture of semiconductor devices, displays, LEDs, photovoltaic panels and the like. Generally, though not necessarily, such tools/processes will be used or conducted together in a common fabrication facility. Lithographic patterning of a film generally includes some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible, UV, or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of electroplating a metal onto a substrate during fabrication of a device, the method comprising:
   (a) providing an electroplating solution to an electroplating system comprising:
      (i) an electroplating cell comprising an anode chamber and a cathode chamber and configured to hold the substrate in the cathode chamber while electroplating the metal onto the substrate,
      (ii) an electroplating solution reservoir configured to hold a portion of the electroplating solution while electroplating the metal onto the substrate,
      (iii) a recirculation system for delivering the electroplating solution between the electroplating cell and the electroplating solution reservoir,
      (iv) a make-up solution inlet for providing make-up solution to the electroplating system,
      (v) a secondary electroplating solution inlet for providing a secondary electroplating solution to the electroplating system, and
      (vi) an outlet for removing the electroplating solution from the electroplating system,
      wherein the electroplating solution comprises multiple components for electroplating the metal onto the substrate;
   (b) electroplating the metal onto the substrate while the substrate is held in the cathode chamber;
   (c) supplying the make-up solution to the electroplating system via the make-up solution inlet, wherein the make-up solution comprises some or all of the multiple components for electroplating the metal onto the substrate, wherein supplying the make-up solution to the electroplating system changes a composition of the electroplating solution so that at least one of the multiple components in the electroplating solution moves closer to its target concentration;
   (d) supplying the secondary electroplating solution to the electroplating system via the secondary electroplating solution inlet, wherein the secondary electroplating solution comprises some or all of the multiple components, and wherein at least one of the following conditions (1) and (2) is satisfied:
      (1) the secondary electroplating solution comprises at least one of the multiple components at a secondary concentration that is significantly higher than its target concentration,
      (2) the secondary electroplating solution comprises at least one of the multiple components at a secondary concentration that is significantly lower than its target concentration; and
   (e) removing the electroplating solution from the electroplating system via the outlet, wherein operations (c) and (e) are part of a bleed-and-feed process,
   wherein the metal is copper, and wherein the secondary electroplating solution comprises copper ions at a secondary concentration that is significantly higher than a target concentration for copper ion in the electroplating solution.

2. The method of claim 1, wherein the secondary electroplating solution comprises copper ions at a secondary concentration that is between about 5 and 50 times greater than a target concentration for copper ion in the electroplating solution.

3. The method of claim 1, wherein the secondary electroplating solution comprises an acid at a secondary concentration that is at a target concentration for the acid.

4. The method of claim 1, wherein the make-up solution inlet, the secondary electrolyte inlet, and the outlet are all located at the electroplating solution reservoir, and wherein the make-up solution inlet is configured to admit the make-up solution to the electroplating solution reservoir, wherein the secondary electroplating solution inlet is configured to admit the secondary electroplating solution to the electroplating solution reservoir, and wherein the outlet is configured to remove the electroplating solution from the electroplating solution reservoir.

5. The method of claim 1, wherein the composition of the secondary electrolyte is configured such as to decrease a bleed-and-feed rate needed to maintain target concentrations of the electroplating solution's components, relative to a bleed-and-feed rate needed to maintain target concentrations of the electroplating solution's components in an absence of the secondary electrolyte addition.

6. The method of claim 1, further comprising repeating operations (b)-(e) to electroplate the metal onto multiple additional substrates.

7. The method of claim 1, wherein the target concentration of copper in the electroplating solution is between about 1 g/L and about 25 g/L, and a copper ion concentration in the secondary electroplating solution is between about 20 g/L and about 70 g/L.

8. A method of electroplating a metal onto a substrate during fabrication of a device, the method comprising:
   (a) providing an electroplating solution to an electroplating system comprising:
      (i) an electroplating cell comprising an anode chamber and a cathode chamber and configured to hold the substrate in the cathode chamber while electroplating the metal onto the substrate,
      (ii) an electroplating solution reservoir configured to hold a portion of the electroplating solution while electroplating the metal onto the substrate,
      (iii) a recirculation system for delivering the electroplating solution between the electroplating cell and the electroplating solution reservoir,
      (iv) a make-up solution inlet for providing make-up solution to the electroplating system,
      (v) a secondary electroplating solution inlet for providing a secondary electroplating solution to the electroplating system, and
      (vi) an outlet for removing the electroplating solution from the electroplating system,
      wherein the electroplating solution comprises multiple components for electroplating the metal onto the substrate;
   (b) electroplating the metal onto the substrate while the substrate is held in the cathode chamber;
   (c) supplying the make-up solution to the electroplating system via the make-up solution inlet, wherein the make-up solution comprises some or all of the multiple components for electroplating the metal onto the substrate, wherein supplying the make-up solution to the electroplating system changes a composition of the electroplating solution so that at least one of the multiple components in the electroplating solution moves closer to its target concentration;

(d) supplying the secondary electroplating solution to the electroplating system via the secondary electroplating solution inlet, wherein the secondary electroplating solution comprises some or all of the multiple components, and wherein at least one of the following conditions (1) and (2) is satisfied:
  (1) the secondary electroplating solution comprises at least one of the multiple components at a secondary concentration that is significantly higher than its target concentration,
  (2) the secondary electroplating solution comprises at least one of the multiple components at a secondary concentration that is significantly lower than its target concentration; and (e) removing the electroplating solution from the electroplating system via the outlet, wherein operations (c) and (e) are part of a bleed-and-feed process, wherein the metal is cobalt, and wherein the secondary electroplating solution comprises cobalt ions at a secondary concentration that is significantly lower than a target concentration for cobalt ion in the electroplating solution.

9. A method of electroplating a metal onto a substrate during fabrication of a device, the method comprising:
  (a) providing an electroplating solution to an electroplating system comprising:
    (i) an electroplating cell comprising an anode chamber and a cathode chamber and configured to hold the substrate in the cathode chamber while electroplating the metal onto the substrate,
    (ii) an electroplating solution reservoir configured to hold a portion of the electroplating solution while electroplating the metal onto the substrate,
    (iii) a recirculation system for delivering the electroplating solution between the electroplating cell and the electroplating solution reservoir,
    (iv) a make-up solution inlet for providing make-up solution to the electroplating system,
    (v) a secondary electroplating solution inlet for providing a secondary electroplating solution to the electroplating system, and
    (vi) an outlet for removing the electroplating solution from the electroplating system,
    wherein the electroplating solution comprises multiple components for electroplating the metal onto the substrate;
  (b) electroplating the metal onto the substrate while the substrate is held in the cathode chamber;
  (c) supplying the make-up solution to the electroplating system via the make-up solution inlet, wherein the make-up solution comprises some or all of the multiple components for electroplating the metal onto the substrate, wherein supplying the make-up solution to the electroplating system changes a composition of the electroplating solution so that at least one of the multiple components in the electroplating solution moves closer to its target concentration;
  (d) supplying the secondary electroplating solution to the electroplating system via the secondary electroplating solution inlet, wherein the secondary electroplating solution comprises some or all of the multiple components, and wherein at least one of the following conditions (1) and (2) is satisfied:
    (1) the secondary electroplating solution comprises at least one of the multiple components at a secondary concentration that is significantly higher than its target concentration,
    (2) the secondary electroplating solution comprises at least one of the multiple components at a secondary concentration that is significantly lower than its target concentration; and
  (e) removing the electroplating solution from the electroplating system via the outlet, wherein operations (c) and (e) are part of a bleed-and-feed process, wherein the metal is copper, and wherein the secondary electroplating solution comprises copper at a significantly higher concentration than the make-up solution.

10. An electroplating system for electroplating metal onto a substrate during fabrication of a device, the electroplating system comprising:
  (a) an electroplating cell comprising an anode chamber and a cathode chamber and configured to hold the substrate in the cathode chamber while electroplating the metal onto the substrate;
  (b) an electroplating solution reservoir configured to hold a portion of an electroplating solution while electroplating the metal onto the substrate;
  (c) a recirculation system for delivering the electroplating solution between the electroplating cell and the electroplating solution reservoir;
  (d) a make up solution inlet for providing make up solution to the electroplating system;
  (e) a secondary electroplating solution inlet for providing a secondary electroplating solution to the electroplating system;
  (f) an outlet for removing the electroplating solution from the electroplating system, wherein the make-up solution inlet (d) and the outlet (f) are configured for an implementation of a bleed-and-feed process; and
  (g) a controller comprising instructions for causing the steps of:
    (i) providing an electroplating solution to the electroplating system, wherein the electroplating solution comprises multiple components for electroplating the metal onto the substrate,
    (ii) electroplating the metal onto the substrate while the substrate is held in the cathode chamber,
    (iii) supplying the make up solution to the electroplating system via the make up solution inlet, wherein the make up solution comprises some or all of the multiple components, wherein supplying the make up solution to the electroplating system changes the electroplating solution's composition so that at least one of the multiple components in the electroplating solution moves closer to its target concentration;
    (iv) supplying the secondary electroplating solution to the electroplating system via the secondary electroplating solution inlet, wherein the secondary electroplating solution comprises some or all of the multiple components, and wherein at least one of the following conditions (1) and (2) is satisfied:
      (1) the secondary electroplating solution comprises at least one of the multiple components at a secondary concentration that is significantly higher than its target concentration,
      (2) the secondary electroplating solution comprises at least one of the multiple components at a secondary concentration that is significantly lower than its target concentration; and (v) removing the electroplating solution from the electroplating system via the outlet, wherein the metal is copper, and wherein the program instructions comprise instructions for causing the secondary electroplating solution to comprise copper ions at a secondary concentration that is significantly higher than a target concentration for copper ion in the electroplating solution.

11. The electroplating system of claim 10, wherein the program instructions comprise instructions for causing the secondary electroplating solution to comprise copper ions at a secondary concentration that is between about 5 and 50 times greater than a target concentration for copper ion in the electroplating solution.

12. The electroplating system of claim 10, wherein the program instructions comprise instructions for causing the secondary electroplating solution to comprise an acid at a secondary concentration that is at a target concentration for the acid.

13. The electroplating system of claim 10, wherein the make-up solution inlet, the secondary electrolyte inlet, and the outlet are all located at the electroplating solution reservoir, and wherein the make-up solution inlet is configured to admit the make-up solution to the electroplating solution reservoir, wherein the secondary electroplating solution inlet is configured to admit the secondary electroplating solution to the electroplating solution reservoir, and wherein the outlet is configured to remove the electroplating solution from the electroplating solution reservoir.

14. The electroplating system of claim 10, wherein the program instructions comprise instructions for causing a composition of the secondary electrolyte to be configured such as to decrease a bleed-and-feed rate needed to maintain target concentrations of the electroplating solution's components, relative to a bleed-and-feed rate needed to maintain target concentrations of the electroplating solution's components in an absence of the secondary electrolyte addition.

15. The electroplating system of claim 10, wherein the program instructions further comprise instructions for causing repetition of operations (i)-(v) to electroplate the metal onto multiple additional substrates.

16. The electroplating system of claim 10, wherein the target concentration of copper in the electroplating solution is between about 1 g/L and about 25 g/L, and the program instructions comprise instructions for causing a copper ion concentration in the secondary electroplating solution to be between about 20 g/L and about 70 g/L.

17. An electroplating system for electroplating metal onto a substrate during fabrication of a device, the electroplating system comprising:
(a) an electroplating cell comprising an anode chamber and a cathode chamber and configured to hold the substrate in the cathode chamber while electroplating the metal onto the substrate;
(b) an electroplating solution reservoir configured to hold a portion of an electroplating solution while electroplating the metal onto the substrate;
(c) a recirculation system for delivering the electroplating solution between the electroplating cell and the electroplating solution reservoir;
(d) a make up solution inlet for providing make up solution to the electroplating system;
(e) a secondary electroplating solution inlet for providing a secondary electroplating solution to the electroplating system;
(f) an outlet for removing the electroplating solution from the electroplating system, wherein the make-up solution inlet (d) and the outlet (f) are configured for an implementation of a bleed-and-feed process; and
(g) a controller comprising instructions for causing the steps of:
(i) providing an electroplating solution to the electroplating system, wherein the electroplating solution comprises multiple components for electroplating the metal onto the substrate,
(ii) electroplating the metal onto the substrate while the substrate is held in the cathode chamber,
(iii) supplying the make up solution to the electroplating system via the make up solution inlet, wherein the make up solution comprises some or all of the multiple components, wherein supplying the make up solution to the electroplating system changes the electroplating solution's composition so that at least one of the multiple components in the electroplating solution moves closer to its target concentration;
(iv) supplying the secondary electroplating solution to the electroplating system via the secondary electroplating solution inlet, wherein the secondary electroplating solution comprises some or all of the multiple components, and wherein at least one of the following conditions (1) and (2) is satisfied:
(1) the secondary electroplating solution comprises at least one of the multiple components at a secondary concentration that is significantly higher than its target concentration,
(2) the secondary electroplating solution comprises at least one of the multiple components at a secondary concentration that is significantly lower than its target concentration; and
(v) removing the electroplating solution from the electroplating system via the outlet, wherein the metal is cobalt, and wherein the program instructions comprise instructions for causing the secondary electroplating solution to comprise cobalt ions at a secondary concentration that is significantly lower than a target concentration for cobalt ion in the electroplating solution.

18. An electroplating system for electroplating metal onto a substrate during fabrication of a device, the electroplating system comprising:
(a) an electroplating cell comprising an anode chamber and a cathode chamber and configured to hold the substrate in the cathode chamber while electroplating the metal onto the substrate;
(b) an electroplating solution reservoir configured to hold a portion of an electroplating solution while electroplating the metal onto the substrate;
(c) a recirculation system for delivering the electroplating solution between the electroplating cell and the electroplating solution reservoir;
(d) a make up solution inlet for providing make up solution to the electroplating system;
(e) a secondary electroplating solution inlet for providing a secondary electroplating solution to the electroplating system;
(f) an outlet for removing the electroplating solution from the electroplating system, wherein the make-up solution inlet (d) and the outlet (f) are configured for an implementation of a bleed-and-feed process; and
(g) a controller comprising instructions for causing the steps of:
(i) providing an electroplating solution to the electroplating system, wherein the electroplating solution comprises multiple components for electroplating the metal onto the substrate, (ii) electroplating the metal onto the substrate while the substrate is held in the cathode chamber, (iii) supplying the make up solution to the electroplating system via the make up solution inlet, wherein the make up solution comprises some or all of the multiple components, wherein supplying the make up solution to the electroplating system changes the electroplating solution's composition so that at least one of the multiple components in the electroplating solution moves closer to its target concentration;

(iv) supplying the secondary electroplating solution to the electroplating system via the secondary electroplating solution inlet, wherein the secondary electroplating solution comprises some or all of the multiple components, and wherein at least one of the following conditions (1) and (2) is satisfied:
  (1) the secondary electroplating solution comprises at least one of the multiple components at a secondary concentration that is significantly higher than its target concentration,
  (2) the secondary electroplating solution comprises at least one of the multiple components at a secondary concentration that is significantly lower than its target concentration; and (v) removing the electroplating solution from the electroplating system via the outlet, wherein the metal is copper, and wherein the program instructions comprise instructions for causing the secondary electroplating solution to comprise copper at a significantly higher concentration than the make-up solution.

* * * * *